(12) United States Patent  
Kori et al.

(10) Patent No.: US 11,782,347 B2  
(45) Date of Patent: Oct. 10, 2023

(54) COMPOSITION FOR FORMING ORGANIC FILM, PATTERNING PROCESS, AND POLYMER

(71) Applicant: SHIN-ETSU CHEMICAL CO., LTD., Tokyo (JP)

(72) Inventors: Daisuke Kori, Joetsu (JP); Kenta Ishiwata, Joetsu (JP); Yasuyuki Yamamoto, Joetsu (JP); Toshiharu Yano, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 306 days.

(21) Appl. No.: 16/926,813

(22) Filed: Jul. 13, 2020

(65) Prior Publication Data

US 2021/0011384 A1 Jan. 14, 2021

(30) Foreign Application Priority Data

Jul. 12, 2019 (JP) .................................. 2019-130218

(51) Int. Cl.
*G03F 7/11* (2006.01)
*C08G 61/02* (2006.01)
*G03F 1/60* (2012.01)
*G03F 1/80* (2012.01)
*G03F 7/075* (2006.01)
*G03F 7/09* (2006.01)
*G03F 7/32* (2006.01)
*G03F 7/20* (2006.01)

(52) U.S. Cl.
CPC ............... *G03F 7/11* (2013.01); *C08G 61/02* (2013.01); *G03F 1/60* (2013.01); *G03F 1/80* (2013.01); *G03F 7/075* (2013.01); *G03F 7/091* (2013.01); *G03F 7/325* (2013.01); *G03F 7/2004* (2013.01)

(58) Field of Classification Search
CPC ........ G03F 7/085; G03F 7/0395; G03F 7/094; G03F 7/091; G03F 7/09; G03F 7/11
See application file for complete search history.

(56) References Cited

U.S. PATENT DOCUMENTS

| | | |
|---|---|---|
| 2005/0255712 A1 | 11/2005 | Kato et al. |
| 2009/0149627 A1 | 6/2009 | Pan et al. |
| 2009/0274978 A1 | 11/2009 | Ohashi et al. |
| 2009/0309488 A1 | 12/2009 | Kato et al. |
| 2010/0099044 A1 | 4/2010 | Hatakeyama et al. |
| 2013/0087529 A1 | 4/2013 | Hatakeyama et al. |
| 2013/0096336 A1 | 4/2013 | Haley et al. |
| 2013/0302990 A1 | 11/2013 | Watanabe et al. |
| 2014/0246400 A1 | 9/2014 | Higashihara et al. |
| 2016/0311975 A1* | 10/2016 | Lee ........................ C08G 65/38 |
| 2017/0018436 A1 | 1/2017 | Hatakeyama et al. |
| 2017/0145030 A1 | 5/2017 | Kashiki et al. |
| 2019/0067021 A1 | 2/2019 | Kori et al. |

FOREIGN PATENT DOCUMENTS

| | | |
|---|---|---|
| EP | 2 301 926 A1 | 3/2011 |
| JP | H06-118651 A | 4/1994 |
| JP | 2002-334869 A | 11/2002 |
| JP | 2004-205685 A | 7/2004 |
| JP | 2005-128509 A | 5/2005 |
| JP | 2005-250434 A | 9/2005 |
| JP | 2006-227391 A | 8/2006 |
| JP | 2006-285095 A | 10/2006 |
| JP | 2006-293298 A | 10/2006 |
| JP | 2007-199653 A | 8/2007 |
| JP | 2008-158002 A | 7/2008 |
| JP | 2009-269953 A | 11/2009 |
| JP | 2010-122656 A | 6/2010 |
| JP | 2013-083833 A | 5/2013 |
| JP | 2013-253227 A | 12/2013 |
| JP | 2017-021337 A | 1/2017 |
| KR | 10-2017-0008682 A | 1/2017 |
| TW | 201008932 A | 3/2010 |
| TW | 201708966 A | 3/2017 |
| WO | 01/42331 A1 | 6/2001 |
| WO | 2004/066377 A1 | 8/2004 |
| WO | 2007/131582 A1 | 11/2007 |
| WO | 2011/159763 A1 | 12/2011 |
| WO | 2013/047106 A1 | 4/2013 |

OTHER PUBLICATIONS

Apr. 8, 2021 Office Action issued in Taiwanese Patent Application No. 109123129.

(Continued)

*Primary Examiner* — Daborah Chacko-Davis
(74) *Attorney, Agent, or Firm* — Oliff PLC

(57) ABSTRACT

A composition for forming an organic film contains a polymer having a partial structure shown by the following general formula (1A) as a repeating unit, and an organic solvent, where AR1 and AR2 each represent a benzene ring or a naphthalene ring which optionally have a substituent; each R represents a hydrogen atom or a monovalent organic group having 2 to 10 carbon atoms and an unsaturated bond; R' represents a single bond or W1; and W1 represents a divalent organic group having 6 to 80 carbon atoms and one or more aromatic rings. This invention provides: a composition for forming an organic film, the composition containing a polymer having an indenofluorene structure with high carbon content and thermosetting property as to enable high etching resistance and excellent twisting resistance; a patterning process using this composition; and a polymer for providing such a composition for forming an organic film.

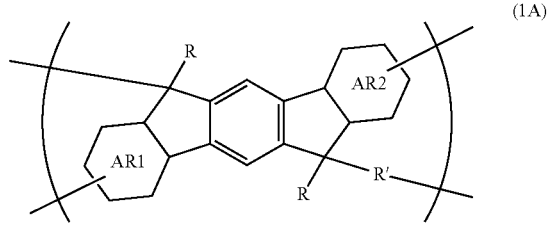

(1A)

20 Claims, 2 Drawing Sheets

(56) References Cited

OTHER PUBLICATIONS

Nov. 24, 2020 Extended European Search Report issued in European Patent Application No. 20184610.2.
Mar. 17, 2022 Office Action issued in Korean Patent Application No. 10-2020-0084965.

* cited by examiner

[FIG. 1]
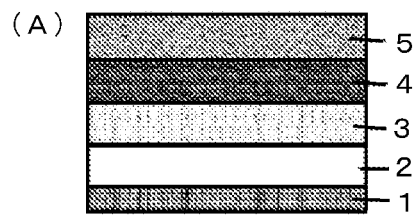
(A)
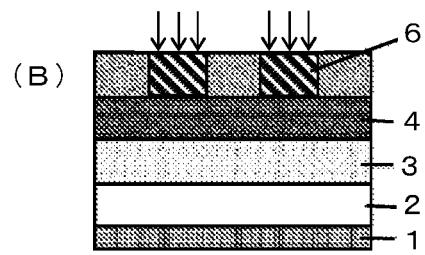
(B)
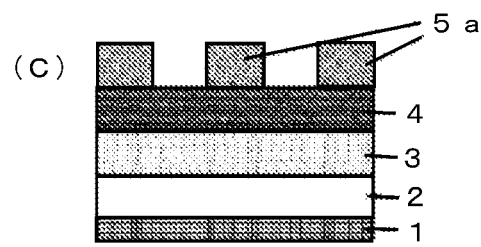
(C)
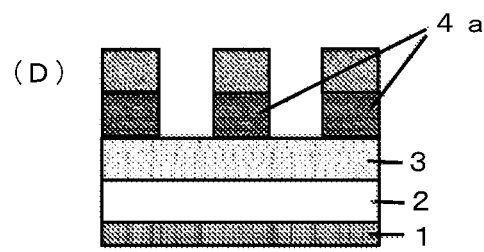
(D)
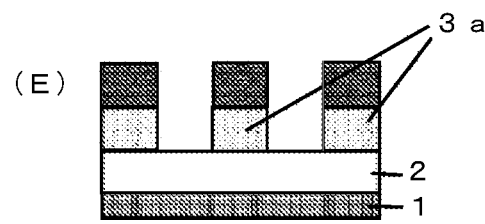
(E)
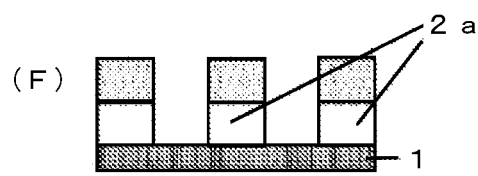
(F)

[FIG. 2]
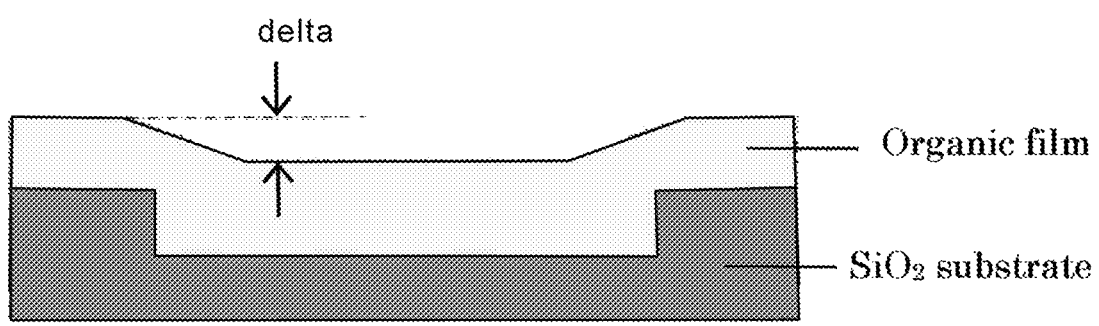

COMPOSITION FOR FORMING ORGANIC FILM, PATTERNING PROCESS, AND POLYMER

TECHNICAL FIELD

The present invention relates to a composition for forming an organic film, a patterning process using the composition, and a polymer contained in the composition.

BACKGROUND ART

Recently, along with advancements toward higher integration and higher processing speed of semiconductor devices, a finer pattern rule has been required. In this situation, various techniques have been developed in regard to how patterning process can be performed more finely and precisely depending on light sources used in lithography with light exposure, which is a commonly-employed technique at present.

As the light source for lithography employed in resist pattern formation, light exposure using a g-line (436 nm) or an i-line (365 nm) of a mercury lamp is widely adopted for portions where the degree of integration is low. Meanwhile, for portions where the degree of integration is high and finer patterning is required, lithography using a KrF excimer laser (248 nm) or an ArF excimer laser (193 nm) with shorter wavelengths has also been practically used. Moreover, for the most-advanced generation requiring further finer patterning, lithography with extreme ultraviolet ray (EUV, 13.5 nm) is about to be put into practical use.

It is well known that in a monolayer resist method, which is employed as a typical resist patterning process, as the thinning of resist patterns progresses as described above, the ratio of a pattern height to a pattern line width (aspect ratio) is increased, and pattern collapse occurs due to the surface tension of a developer during development. It is known that, in this situation, a multilayer resist method, in which a pattern is formed by laminating films having different dry etching properties, is excellent in forming a pattern with a high aspect ratio on an uneven substrate. There have been developed: a two-layer resist method in which a photoresist layer made of a silicon-containing photosensitive polymer is combined with an underlayer made of an organic polymer containing carbon, hydrogen, and oxygen as main constituent elements, for example, a novolak polymer (Patent Document 1 etc.); and a three-layer resist method in which a photoresist layer made of an organic photosensitive polymer used in a monolayer resist method is combined with a silicon-containing resist underlayer film made of a silicon-based polymer or a silicon-based CVD film, and an organic film made of an organic polymer (Patent Document 2 etc.).

In this three-layer resist method, first, a fluorocarbon-based dry etching gas is used to transfer the pattern of the photoresist layer to the silicon-containing resist underlayer film. Then, using the pattern as a mask, dry etching with an oxygen-containing gas is performed to transfer the pattern to the organic film containing carbon and hydrogen as main constituent elements. By dry etching using the resultant as a mask, the pattern is formed on a substrate to be processed. However, in semiconductor device manufacturing processes after the 20-nm generation, when the pattern is transferred to a substrate to be processed by dry etching using such an organic film pattern as a hard mask, phenomena are observed in which the organic film pattern is twisted and/or curved.

The carbon hard mask formed immediately above the substrate to be processed is generally an amorphous carbon (hereinafter CVD-C) film prepared by a CVD method using a methane gas, an ethane gas, an acetylene gas, or the like as raw materials. It is known that the amount of hydrogen atoms in the CVD-C film can be reduced quite small, and the CVD-C film is very effective against the twisting and curving of the pattern as described above. Nevertheless, it is also known that when the substrate to be processed used as a base has a step, it is difficult to fill such a step into a flat state due to the characteristics of the CVD process. As a result, when a substrate to be processed having a step is coated with a CVD-C film and then patterned with a photoresist, the step of the substrate to be processed causes the applied surface of the photoresist to have a step. This makes the photoresist film thickness non-uniform, and consequently the focus margin and the pattern profile during lithography degraded.

On the other hand, it is known that when an organic film serving as the carbon hard mask formed immediately above the substrate to be processed is formed by a spin coating method, there is an advantage that a step(s) of the uneven substrate can be filled into a flat state. Planarizing the substrate by using the organic film material reduces fluctuations in film thicknesses of a silicon-containing resist underlayer film and a resist upper layer film coated thereon, can increase the focus margin in lithography, and can form a correct pattern.

Hence, there are demands for: an organic film material which allows formation of an organic film by a spin coating method, the organic film enabling formation of a film having high etching resistance in dry etching a substrate to be processed and high planarizing property on the substrate to be processed; and a method for forming such an organic film.

Conventionally, condensed resins using aromatic alcohols and carbonyl compounds such as ketones and aldehydes as condensing agents for a phenol compound or naphthol compound have been known as the material for forming an organic film for multilayer resist methods. Examples of such condensed resins include a fluorene bisphenol novolak resin described in Patent Document 2, a bisphenol compound and a novolak resin thereof described in Patent Document 3, a novolak resin of an adamantane phenol compound described in Patent Document 4, a bisnaphthol compound and a novolak resin thereof described in Patent Document 5, etc. The main skeletons of the resins used in these materials are naphthalene, fluorene, adamantane, or the like, each of which has high carbon density. However, their etching resistance and twisting resistance are not sufficient, and further improvements in etching have been desired.

To prevent the etching resistance degradation, no heteroatom such as oxygen is incorporated into a resin for organic film material. As an example of such a resin, Patent Document 6 describes a resin having a fluorene structure. Nevertheless, to form a cured film, a methylol compound or the like is added as a crosslinking agent to a composition. For this reason, when this composition is used to form a cured film, even if the carbon content of the resin is increased, this increase is offset by the low carbon content of the crosslinking agent, resulting in the problem of etching resistance degradation.

Furthermore, there is an organic film material having an indenofluorene structure as a partial structure with high carbon density. Examples of such a compound or polymer thereof include a single-molecular compound having a single-molecular naphthol structure described in Patent Document 7, and a novolak resin obtained by using such a single-molecular compound, etc. Nevertheless, since a structure containing multiple oxygen atoms is used in the repeating unit, the etching resistance needs to be improved.

CITATION LIST

Patent Literature

Patent Document 1: JP H06-118651 A
Patent Document 2: JP 2005-128509 A
Patent Document 3: JP 2006-293298 A
Patent Document 4: JP 2006-285095 A
Patent Document 5: JP 2010-122656 A
Patent Document 6: WO 2013/047106 A1
Patent Document 7: JP 2017-21337 A

SUMMARY OF INVENTION

Technical Problem

The present invention has been made in view of the above-described circumstances. An object of the present invention is to provide a composition for forming an organic film, the composition containing a polymer having an indenofluorene structure with high carbon content and thermosetting properties as to enable high etching resistance and excellent twisting resistance; a patterning process using this composition; and a polymer for providing such a composition for forming an organic film.

Solution to Problem

To achieve the object, the present invention provides a composition for forming an organic film, comprising:
a polymer having a partial structure shown by the following general formula (1A) as a repeating unit; and
an organic solvent,

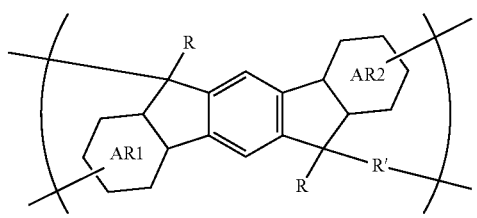

(1A)

wherein AR1 and AR2 each represent a benzene ring or a naphthalene ring which optionally have a substituent; each R represents a hydrogen atom or a monovalent organic group having 2 to 10 carbon atoms and an unsaturated bond; R' represents a single bond or W1; and W1 represents a divalent organic group having 6 to 80 carbon atoms and one or more aromatic rings.

When an organic film formed from this composition containing the polymer shown by the general formula (1A) is heated, dehydrogenative coupling reaction involving hydrogen atoms located at the benzylic positions shown as R or thermal crosslinking at the unsaturated bond takes place, so that an organic film is successfully formed whose main constituent component is an indenofluorene ring, which is high-carbon structure for exhibiting high etching resistance. Since the film has few heteroatoms such as oxygen atoms but high carbon content in the main structure, the organic film thus formed has high dry etching resistance. Moreover, the polymer has two or more crosslinking groups in the repeating units. This makes it possible to form a finer organic film than when a single-molecular compound is used to which only a limited number of crosslinking groups can be introduced. This finer organic film is excellent in heat resistance and twisting resistance, too. Further, the polymer having a molecular-weight distribution is used instead of highly crystalline single-molecular compound, and thus excellent film formability is exhibited on substrates having complicated structures and made of various materials. Additionally, the content of the low-molecular-weight component as a source of sublimation product is so low that outgassing can be suppressed during baking.

The general formula (1A) is preferably shown by the following general formula (1B),

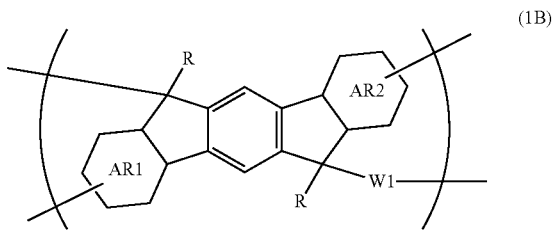

(1B)

wherein AR1, AR2, R, and W1 are as defined above.

The use of the polymer having the indenofluorene structure introduced in the main chain enhances the carbon density, and enables formation of an organic film excellent in etching resistance and twisting resistance. In addition, the solvent solubility, filling and planarizing properties, film formability, adhesiveness to a substrate, and so forth can be adjusted by appropriately selecting the structure of W1, in accordance with the required performances.

In the general formulae (1A) and (1B), each R is preferably a hydrogen atom or any structure shown in the following formula (1C),

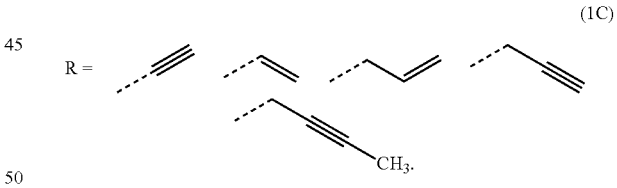

(1C)

Introducing such R as the crosslinking group into the polymer makes it possible to form an organic film having sufficient thermosetting properties as well as excellent etching resistance, twisting resistance, and filling and planarizing properties.

The divalent organic group represented by W1 preferably has at least any of a naphthalene ring, a fluorene ring, and a carbazole ring.

The use of the polymer having the aforementioned partial structure introduced in W1 enables the formation of an organic film excellent in heat resistance, etching resistance, twisting resistance, and film formability.

The polymer preferably has a weight-average molecular weight of 1000 to 5000.

When the composition for forming an organic film contains such a polymer having a weight-average molecular weight in this range, outgassing can be suppressed during baking without impairing the solubility into the organic solvent.

The organic solvent is preferably a mixture of one or more organic solvents each having a boiling point of lower than 180° C. and one or more organic solvents each having a boiling point of 180° C. or higher.

When the organic solvent is the mixture described as above, the addition of the high-boiling-point solvent(s) to the polymer imparts thermal flowability to the resulting organic film. Thus, the composition for forming an organic film has both high filling and planarizing properties.

The composition for forming an organic film preferably further comprises at least one of a surfactant and a plasticizer.

Incorporating the additive(s) makes the composition for forming an organic film more excellent in coatability and filling and planarizing properties.

The present invention provides a patterning process comprising the steps of:
forming an organic film by using the above-described composition for forming an organic film on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching using the resist upper layer film having the formed circuit pattern as a mask;
transferring the pattern to the organic film by etching using the silicon-containing resist underlayer film having the transferred pattern as a mask; and
etching the body to be processed using the organic film having the transferred pattern as a mask to form the pattern in the body to be processed.

The patterning process according to the three-layer resist process described above makes it possible to precisely form a fine pattern in a substrate to be processed.

The present invention provides a patterning process comprising the steps of:
forming an organic film by using the above-described composition for forming an organic film on a body to be processed;
forming a silicon-containing resist underlayer film by using a silicon-containing resist underlayer film material on the organic film;
forming an organic antireflective coating (BARC) on the silicon-containing resist underlayer film;
forming a resist upper layer film by using a photoresist composition on the BARC;
forming a circuit pattern in the resist upper layer film;
successively transferring the pattern to the BARC and the silicon-containing resist underlayer film by etching using the resist upper layer film having the formed circuit pattern as a mask;
transferring the pattern to the organic film by etching using the silicon-containing resist underlayer film having the transferred pattern as a mask; and
etching the body to be processed using the organic film having the transferred pattern as a mask to form the pattern in the body to be processed.

The patterning process according to the four-layer resist process described above makes it possible to further precisely form a fine pattern in a substrate to be processed.

The present invention provides a patterning process comprising the steps of:
forming an organic film by using the above-described composition for forming an organic film on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching using the resist upper layer film having the formed circuit pattern as a mask;
transferring the pattern to the organic film by etching using the inorganic hard mask having the formed pattern as a mask; and
etching the body to be processed using the organic film having the formed pattern as a mask to form the pattern in the body to be processed.

The patterning process according to this three-layer resist process makes it possible to precisely form a fine pattern in a substrate to be processed.

Further, the present invention provides a patterning process comprising the steps of:
forming an organic film by using the above-described composition for forming an organic film on a body to be processed;
forming an inorganic hard mask selected from a silicon oxide film, a silicon nitride film, and a silicon oxynitride film on the organic film;
forming a BARC on the inorganic hard mask;
forming a resist upper layer film by using a photoresist composition on the BARC;
forming a circuit pattern in the resist upper layer film;
successively transferring the pattern to the BARC and the inorganic hard mask by etching using the resist upper layer film having the formed circuit pattern as a mask;
transferring the pattern to the organic film by etching using the inorganic hard mask having the formed pattern as a mask; and
etching the body to be processed using the organic film having the formed pattern as a mask to form the pattern in the body to be processed.

The patterning process according to this four-layer resist process makes it possible to more precisely form a fine pattern in a substrate to be processed.

The inorganic hard mask is preferably formed by a CVD method or an ALD method.

When the inorganic hard mask is formed by a CVD method or an ALD method, a fine pattern can be formed more precisely in a substrate to be processed.

The circuit pattern is preferably formed in the resist upper layer film by a photolithography with a wavelength of 10 nm or more and 300 nm or less, direct lithography with electron beam, nanoimprinting, or a combination thereof.

When these methods are employed as the method for forming the circuit pattern in the resist upper layer film, a fine pattern can be formed more precisely in a substrate to be processed.

Preferably, alkali development or organic solvent development is employed as a development method.

When the development method is performed using an alkali or organic solvent, it is possible to more precisely form a fine pattern in a substrate to be processed.

The body to be processed is preferably a semiconductor device substrate, a metal film, a metal carbide film, a metal oxide film, a metal nitride film, a metal oxycarbide film, or a metal oxynitride film.

In the present invention, the aforementioned bodies to be processed are usable, for example.

The metal is preferably silicon, titanium, tungsten, hafnium, zirconium, chromium, germanium, cobalt, copper, silver, gold, aluminum, indium, gallium, arsenic, palladium, iron, tantalum, iridium, molybdenum, ruthenium, or an alloy thereof.

These can be used as the metal.

Furthermore, the present invention provides a polymer comprising a partial structure shown by the following general formula (1A) as a repeating unit,

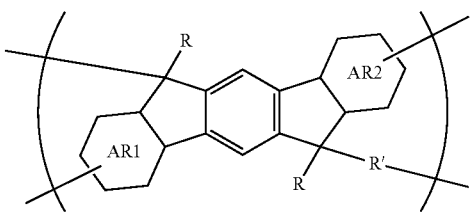

(1A)

wherein AR1 and AR2 each represent a benzene ring or a naphthalene ring which optionally have a substituent; each R represents a hydrogen atom or a monovalent organic group having 2 to 10 carbon atoms and an unsaturated bond; R' represents a single bond or W1; and W1 represents a divalent organic group having 6 to 80 carbon atoms and one or more aromatic rings.

The polymer shown by the general formula (1A) has thermosetting property and the main chain constituted of an indenofluorene ring structure with high carbon content. Thus, the polymer is capable of forming an organic film having both high curving resistance and high dry etching resistance.

The general formula (1A) is preferably shown by the following general formula (1B),

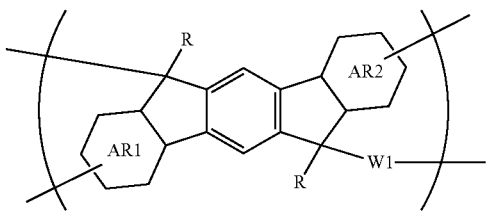

(1B)

wherein AR1, AR2, R, and W1 are as defined above.

The indenofluorene structure introduced in the main chain increases the carbon density, so that an organic film excellent in etching resistance and twisting resistance is successfully formed. Moreover, the solvent solubility, filling and planarizing properties, film formability, adhesiveness to a substrate, and so forth can be adjusted depending on the structure of W1, in accordance with the required performances.

In the general formulae (1A) and (1B), each R is preferably a hydrogen atom or any structure shown in the following formula (1C),

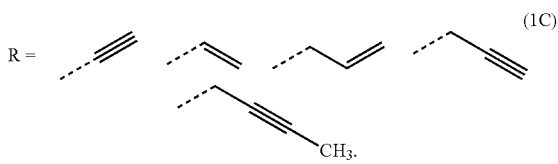

(1C)

Such R acts as a thermal-crosslinking group, and the polymer containing at least one crosslinking group in the repeating unit is thus capable of forming a fine cured film. Therefore, the polymer is suitable for forming an organic film excellent in etching resistance and twisting resistance.

The divalent organic group represented by W1 preferably has at least any of a naphthalene ring, a fluorene ring, and a carbazole ring.

Introducing such a condensed carbon ring structure in the main skeleton of the polymer improves the solvent solubility and film formability without impairing the carbon density, and can impart thermal flowability without impairing the heat resistance.

Advantageous Effects of Invention

As described above, the inventive polymer has a thermal-crosslinking group in every repeating unit, and the main chain structure is constituted of indenofluorene that is a high-carbon density structure excellent in etching resistance. Hence, the polymer is capable of forming a fine film with high carbon density by thermal curing. Accordingly, the polymer is useful for forming an organic film excellent in etching resistance and twisting resistance. Moreover, the organic film composition containing this polymer is a useful material for forming an organic film having excellent etching resistance and twisting resistance as well as various properties such as heat resistance, and filling and planarizing properties. Thus, the inventive composition for forming an organic film is quite useful as an organic film material in multilayer resist processes, for example, a two-layer resist process, a three-layer resist process using a silicon-containing resist underlayer film, and a four-layer resist process using a silicon-containing resist underlayer film and an organic antireflective coating. Further, the inventive patterning processes make it possible to precisely form a fine pattern in a substrate to be processed in such multilayer resist processes.

BRIEF DESCRIPTION OF DRAWINGS

FIG. 1 shows an exemplary process flow of the inventive patterning process.

FIG. 2 is a cross-sectional view for illustrating an exemplary organic film formed by applying the inventive organic film composition on a SiO$_2$ wafer substrate having a trench pattern.

DESCRIPTION OF EMBODIMENTS

As described above, there have been demands for the development of a composition for forming an organic film, the composition containing a polymer having an indenofluorene structure with high carbon content and thermosetting property as to enable high etching resistance and excellent twisting resistance.

The present inventors have earnestly studied the above-described object and consequently found that when a composition for forming an organic film contains a polymer having a partial structure shown by the following general formula (1A) as a repeating unit and an organic solvent, the composition consequently forms an organic film which has excellent etching resistance and twisting resistance as well as various properties such as heat resistance, filling and planarizing properties, film formability, and low sublimation-component content. This finding has led to the completion of the present invention.

Specifically, the present invention provides a composition for forming an organic film, comprising:
a polymer having a partial structure shown by the following general formula (1A) as a repeating unit; and
an organic solvent,

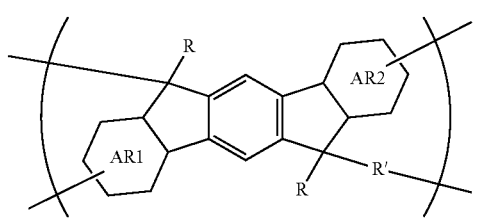
(1A)

wherein AR1 and AR2 each represent a benzene ring or a naphthalene ring which optionally have a substituent; each R represents a hydrogen atom or a monovalent organic group having 2 to 10 carbon atoms and an unsaturated bond; R' represents a single bond or W1; and W1 represents a divalent organic group having 6 to 80 carbon atoms and one or more aromatic rings.

Further, the present invention provides a polymer comprising a partial structure shown by the general formula (1A) as a repeating unit.

Hereinafter, embodiments of the present invention will be described, but the present invention is not limited thereto.

[Polymer]

The inventive composition for forming an organic film contains a polymer with a repeating unit shown by the following general formula (1A) as a partial structure.

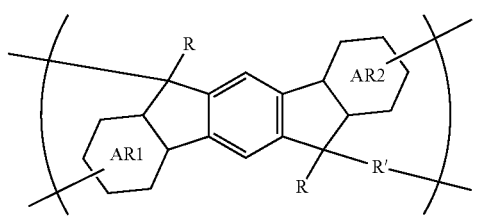
(1A)

In the general formula (1A), AR1 and AR2 are each a benzene ring or a naphthalene ring which optionally have a substituent. R is a hydrogen atom or a monovalent organic group having 2 to 10 carbon atoms and an unsaturated bond. R' is a single bond or W1. W1 is a divalent organic group having 6 to 80 carbon atoms and one or more aromatic rings.

Examples of the partial structure including AR1 and AR2 in the main chain of the polymer shown in the general formula (1A) include the following. In the polymer, these optionally have a substituent on aromatic rings thereof. Examples of the substituent include a vinyl group, an ethynyl group, an ethynylphenyl group, an allyl group, a propargyl group, an aryl group, an allyloxy group, a propargyloxy group, etc. Among the following structures, a structure in which both AR1 and AR2 are benzene rings is preferable in view of availability of the raw material.

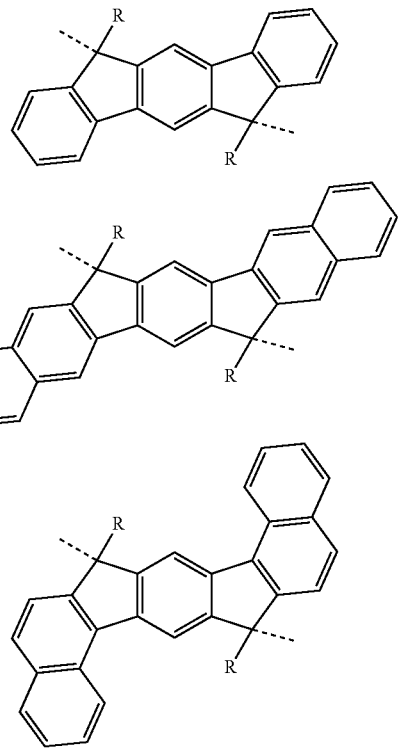

Examples of the substituent represented by R in the general formula (1A) include a hydrogen atom and the following. In the polymer, these optionally have a substituent on aromatic rings thereof. Examples of the substituent include a hydroxyl group, a methyl group, a methoxy group, a nitro group, a halogen group, a trifluoromethyl group, etc.

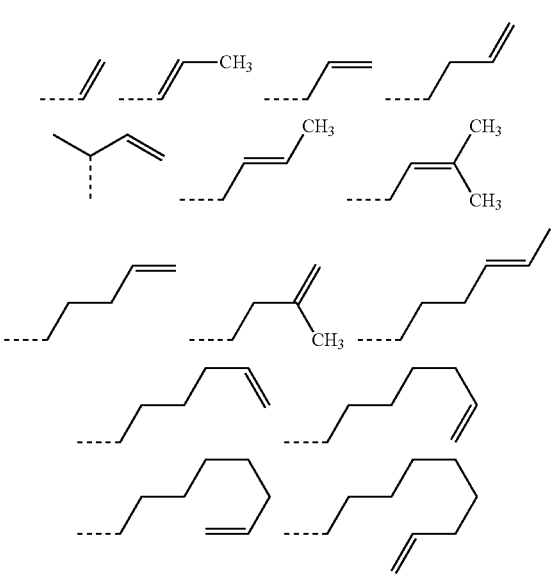

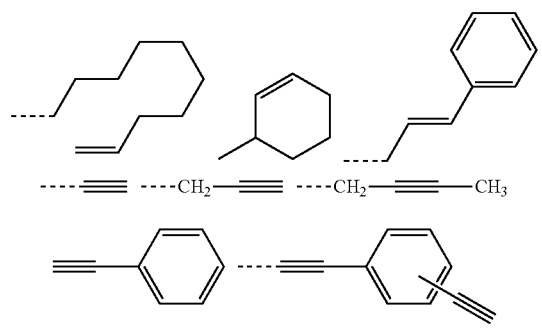
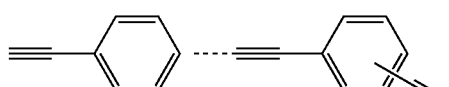

The general formula (1A) may be shown by the following general formula (1B).

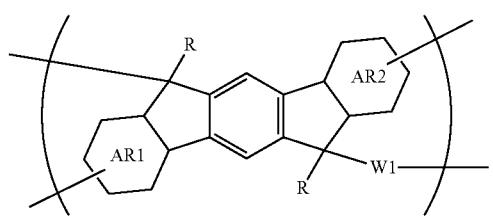

(1B)

Examples of the partial structure represented by W1 in this general formula include the following, and the like. These optionally have a substituent on aromatic rings thereof. Examples of the substituent include a hydroxyl group, an alkyl group, a methoxy group, a propargyloxy group, an allyloxy group, a nitro group, a halogen group, a trifluoromethyl group, an acetyl group, a vinyl group, an ethynyl group, an ethynylphenyl group, an allyl group, an aryl group, etc. Each hydrogen atom on a nitrogen atom below may be substituted with an alkyl group, an acetyl group, a propargyl group, an allyl group, a vinyl group, an aryl group, or the like.

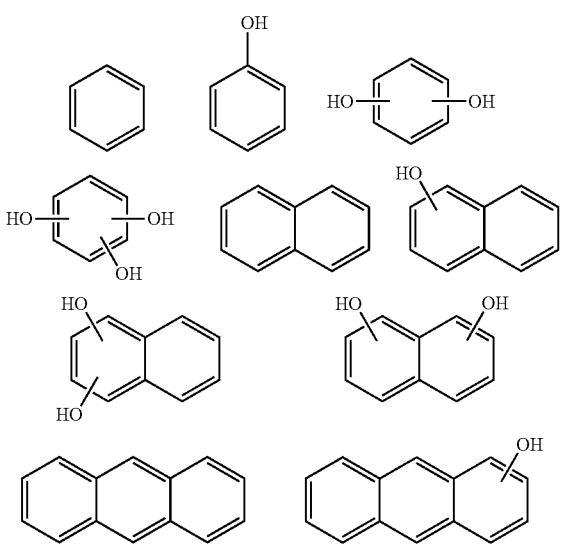

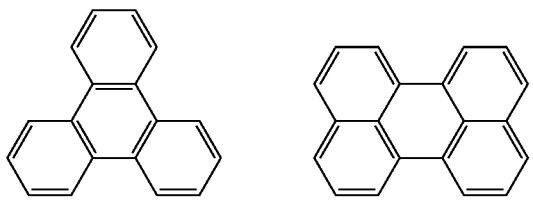
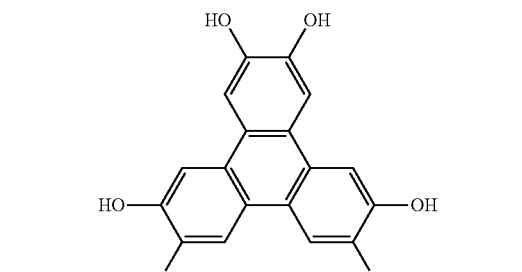
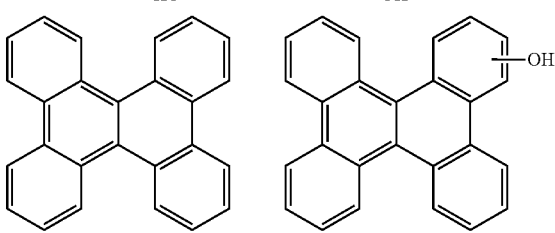
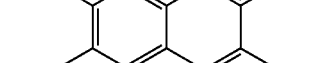
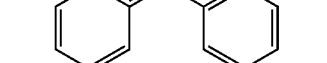

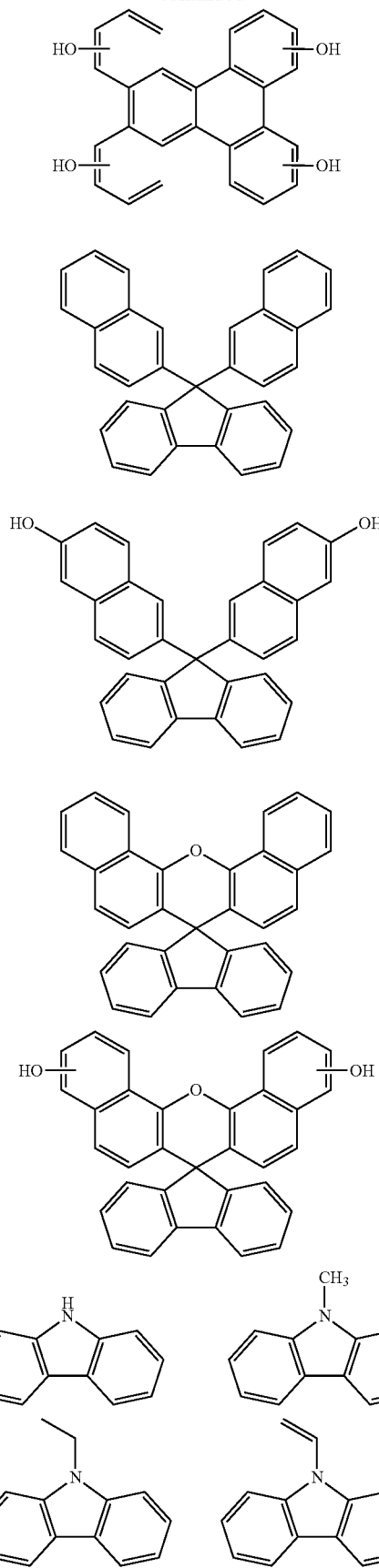
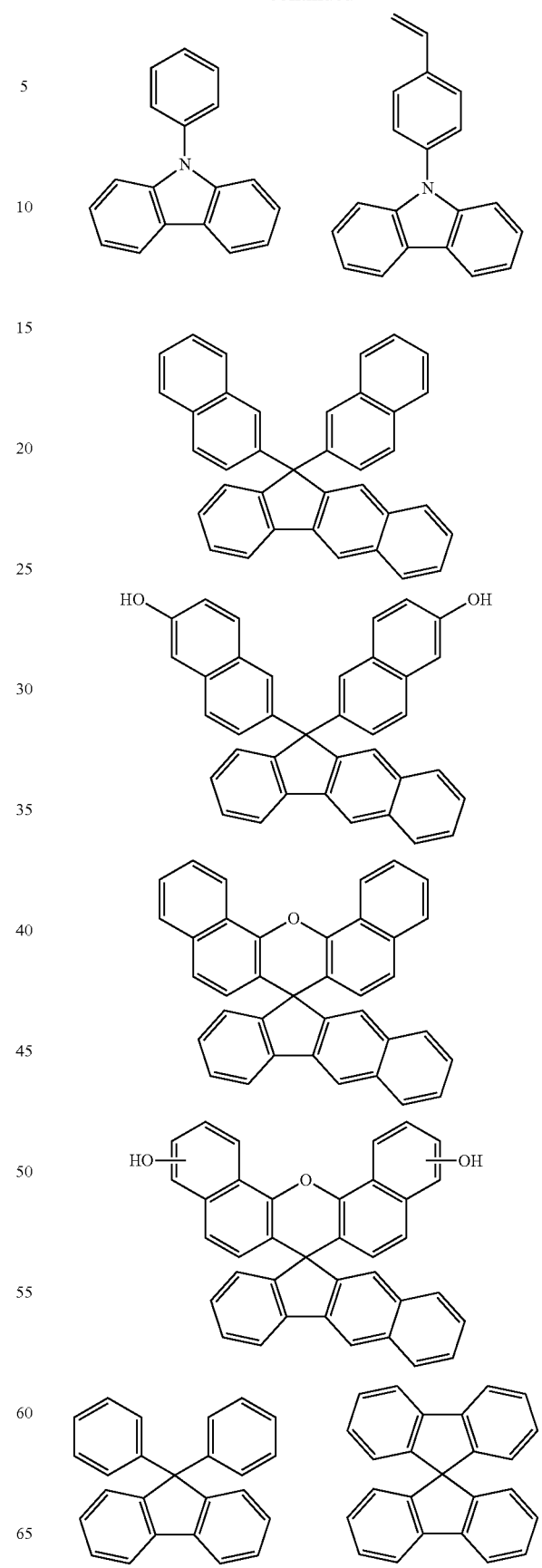

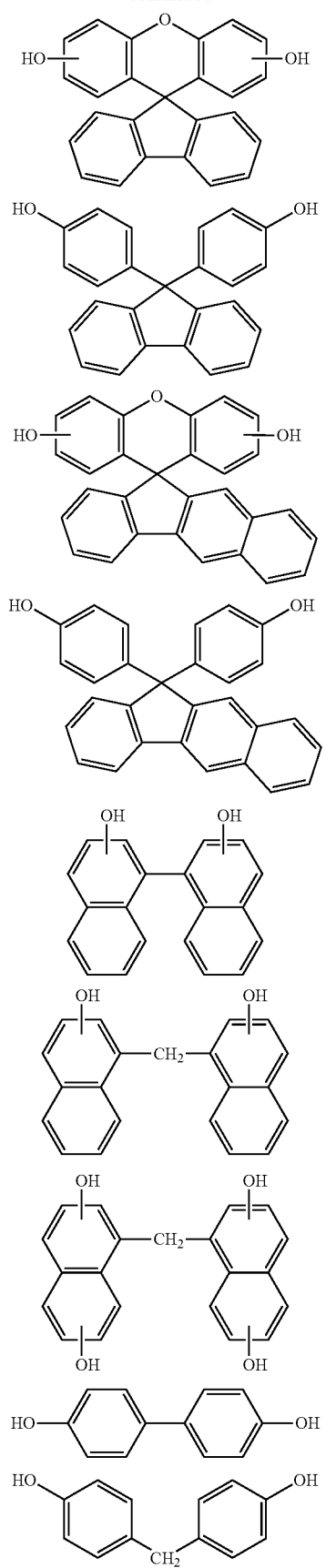

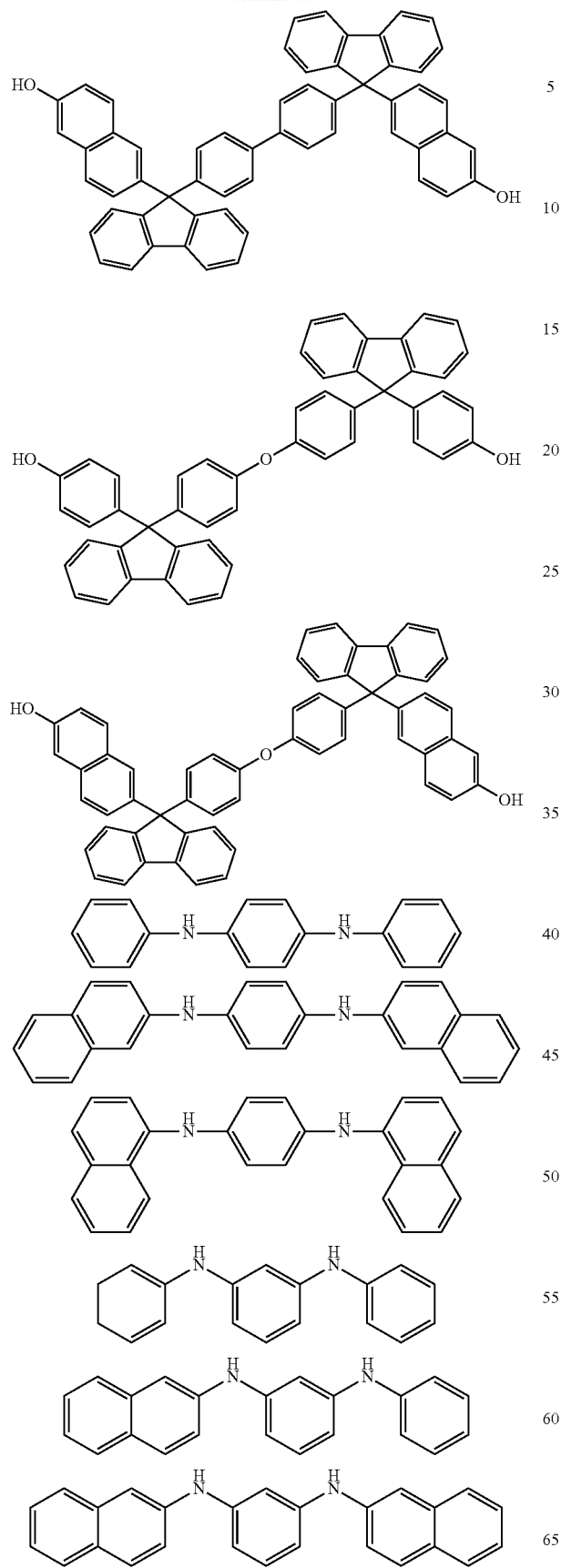

-continued
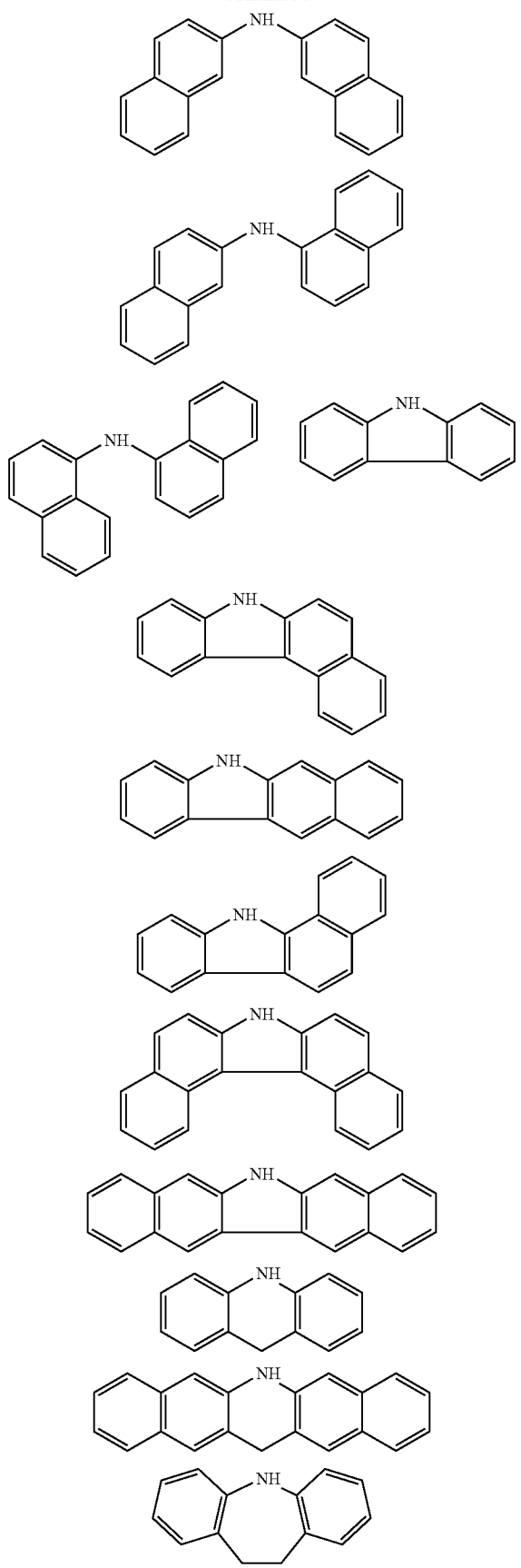
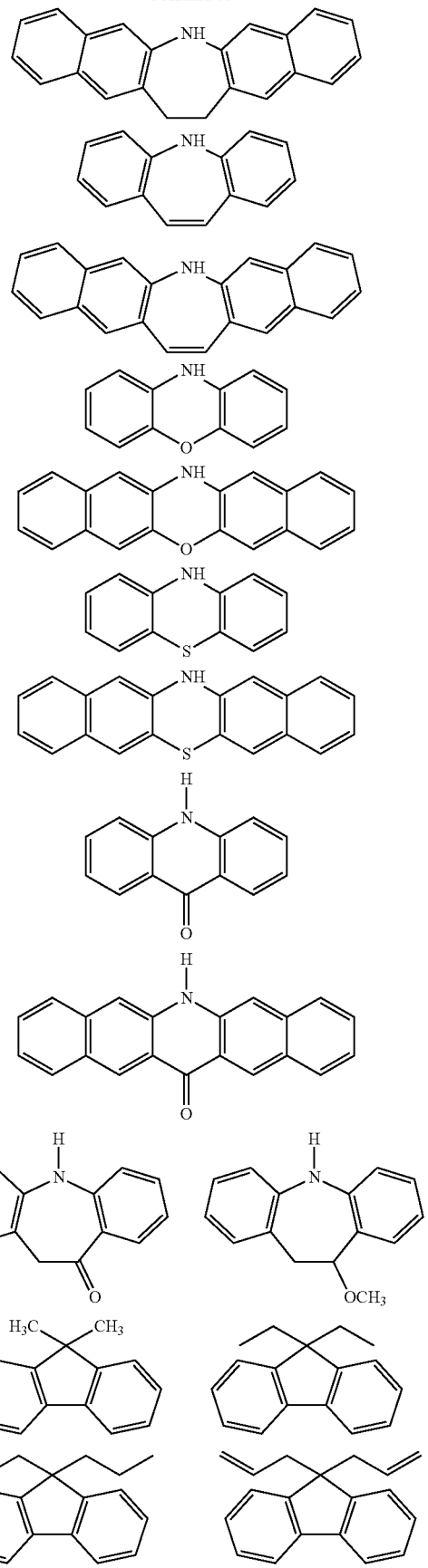

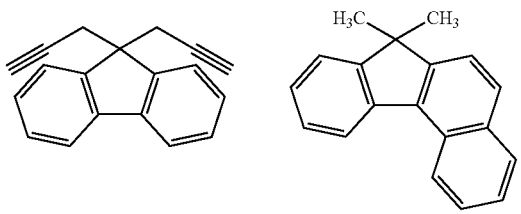
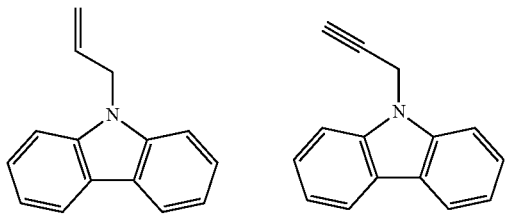

In the general formulae (1A) and (1B), each R is preferably a hydrogen atom or any of the following, from the viewpoints of curability and availability of the raw materials. Among these, hydrogen, a propargyl group, and an allyl group are more preferable from the viewpoints of imparting solvent solubility and availability of the raw materials.

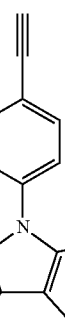

(1C)

The divalent organic group represented by W1 in the general formula (1B) preferably has at least any of a naphthalene ring, a fluorene ring, and a carbazole ring. Specific examples of these include the following.

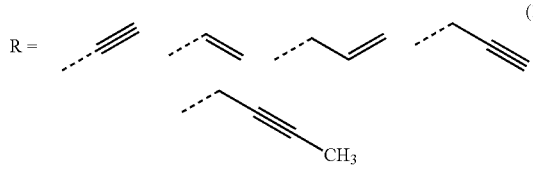

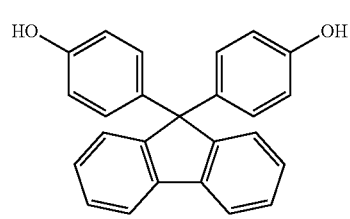

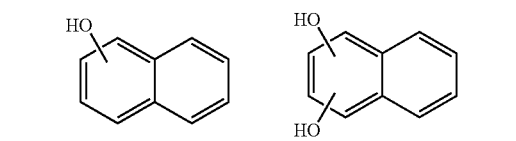

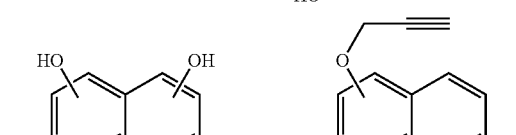

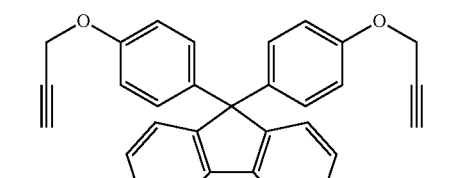

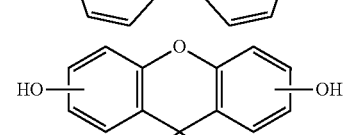

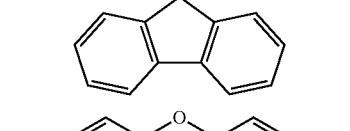

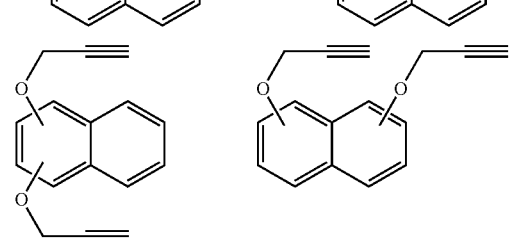

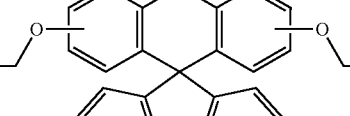

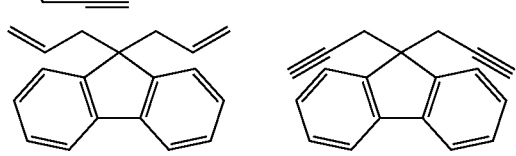

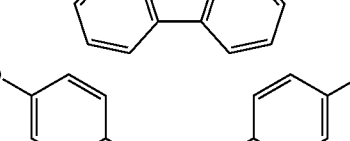

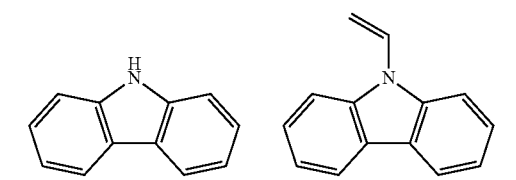

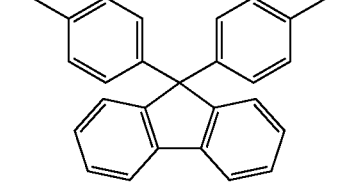

23
-continued
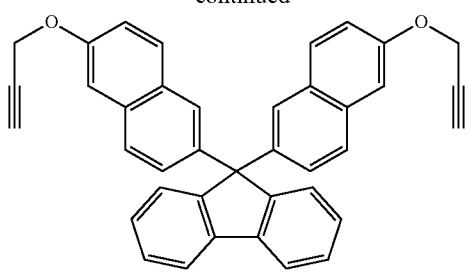
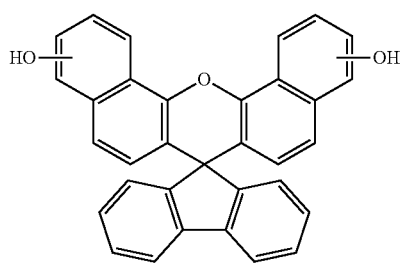
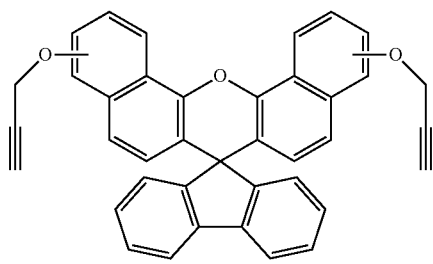
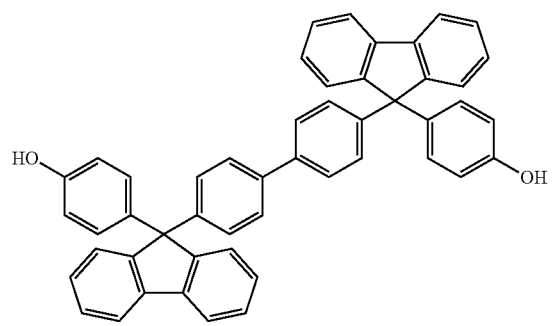
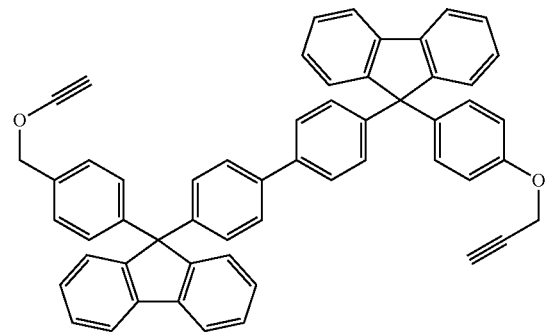
24
-continued
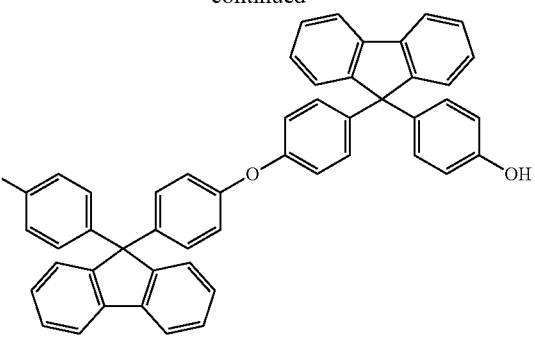
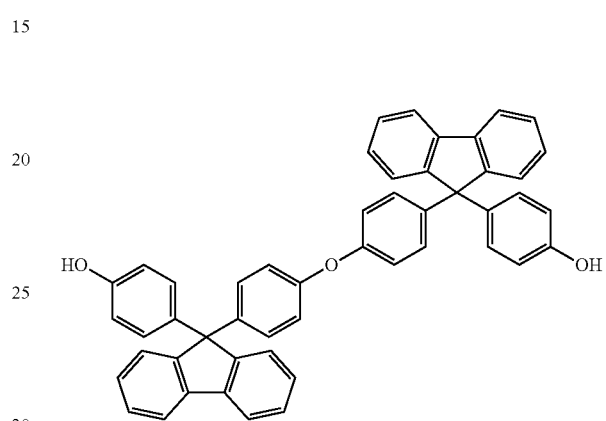
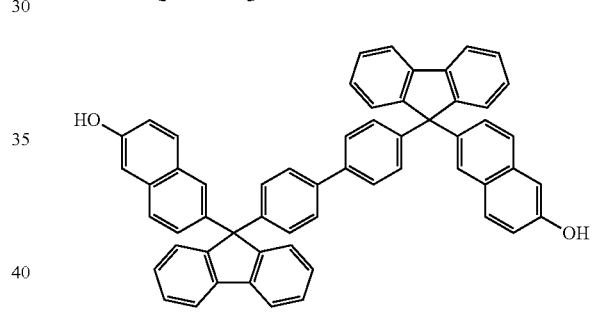
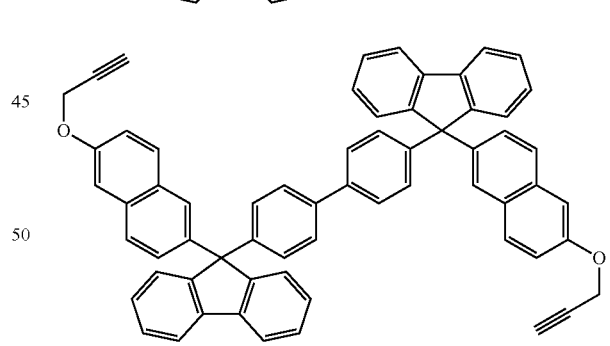
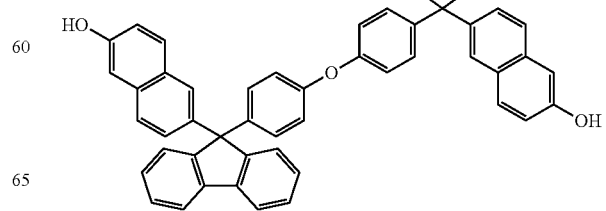

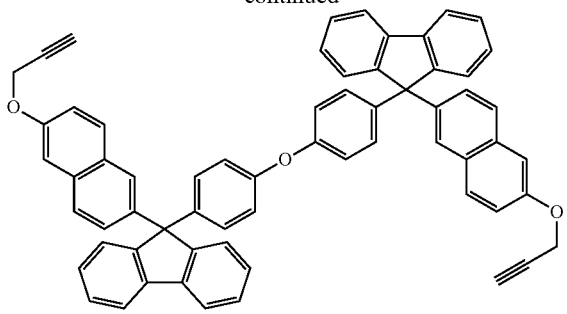

Further, the polymer has a weight-average molecular weight (Mw) of preferably 1000 to 5000, more preferably 1000 to 4500.

With such a molecular weight, the solubility of the polymer into the organic solvent can be guaranteed, and the generation of sublimation product can be suppressed during baking. Moreover, the polymer has favorable thermal flowability. Accordingly, the composition blended with the polymer can not only favorably fill a fine structure formed on a substrate but also form an organic film while planarizing the entire substrate.

[Polymer Production Method 1]

As an example of the method for producing the inventive polymer, an electrophilic substitution reaction can be performed on an aromatic ring of an indenofluorene ring accompanied by dehydration as shown below in which a diol having R's as substituents is used as a monomer. In the following scheme, AR1, AR2, and R are as defined above.

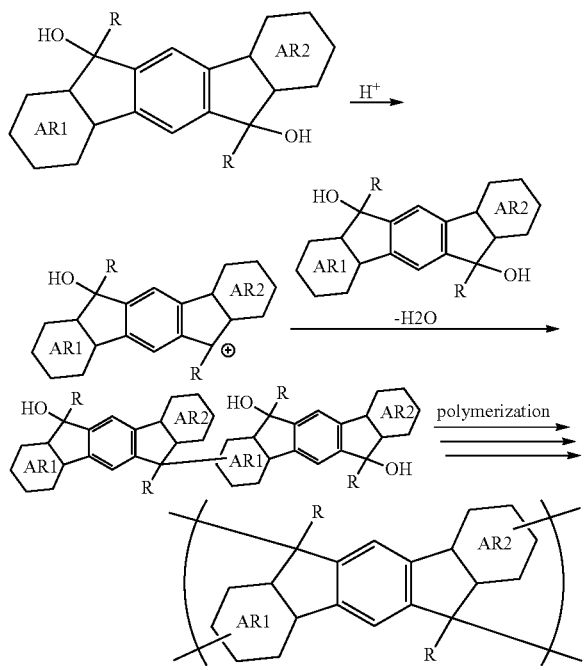

The inventive polymer having W1 in the partial structure shown by the general formula (1B) can be synthesized by polycondensation using a diol and W1 as monomers as shown below. In the following reaction scheme, AR1, AR2, R, and W1 are as defined above.

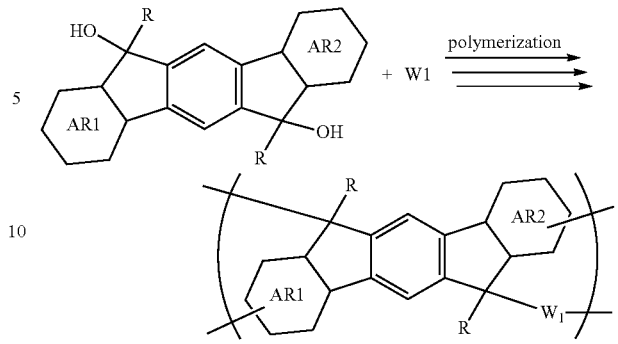

In this case, when a dimeric compound is prepared from a mixture of diols and W1, the following patterns are conceivable: diols react with each other (Pattern 1); and a diol reacts with W1 (Pattern 2). It can be expected that complex products are yielded as the degree of polymerization is increased because of possibilities of the reaction with W1 or diol. Accordingly, in the present invention, the two possibilities are considered, and the structure shown by the chemical formula (1B) is formulated as the general formula.

Pattern 1:

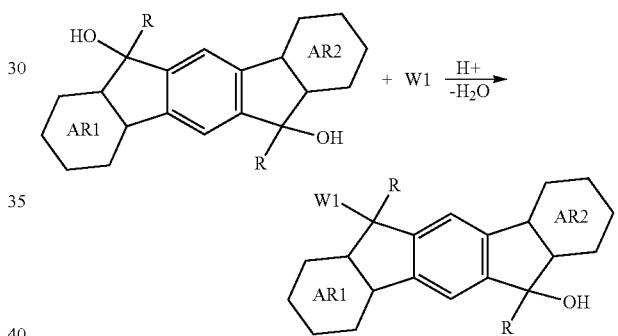

Pattern 2:

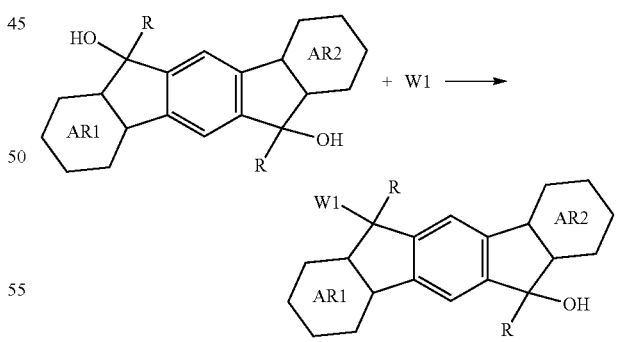

The polymer having the partial structure shown by the general formula (1A) as a repeating unit can be obtained generally in an organic solvent in the presence of an acid catalyst at room temperature or under cooling or heating as necessary. Examples of the acid catalyst that can be used include inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

The solvent is not particularly limited. Examples thereof include alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; and non-protic polar solvents such as dimethylsulfoxide, N,N-dimethylformamide, and hexamethylphosphoric triamide. One of these or a mixture of two or more thereof can be used.

The reaction method includes a method in which the diol compound is used alone, or the diol compound and W1 are used as a monomer(s), and the monomer(s) and an acid catalyst are charged at once; a method in which the monomers are dispersed or dissolved, and then a catalyst is added at once or intermittently; a method in which a catalyst is diluted with a solvent and then added dropwise; a method in which a catalyst is dispersed or dissolved, and then the monomers are added at once or intermittently; and a method in which the monomers are diluted with a solvent and added dropwise. After completion of the reaction, the resultant may be diluted with an organic solvent and then subjected to liquid separation and washing to remove the catalyst having been used for the reaction and to collect the target product.

Further, in these reactions, another compound different from the above-described monomers but capable of polycondensation can be used to carry out co-polycondensation. Examples of such co-polycondensable compound include fluorenol and diol compounds as shown below. These compounds optionally have a substituent on aromatic rings thereof. Examples of the substituent include a vinyl group, an ethynyl group, an ethynylphenyl group, an allyl group, a propargyl group, an aryl group, an allyloxy group, a propargyloxy group, etc. From the viewpoints of imparting etching resistance and solvent solubility, the polycondensable compound preferably has a naphthalene ring, a fluorene structure, or a carbazole structure. Such a compound can be added when the reaction takes place by the aforementioned method, or added at another timing, and then subjected to the co-polycondensation.

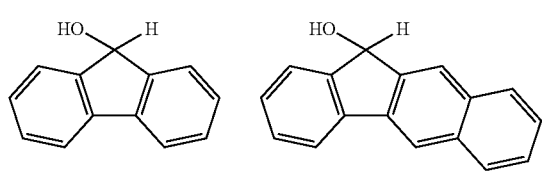

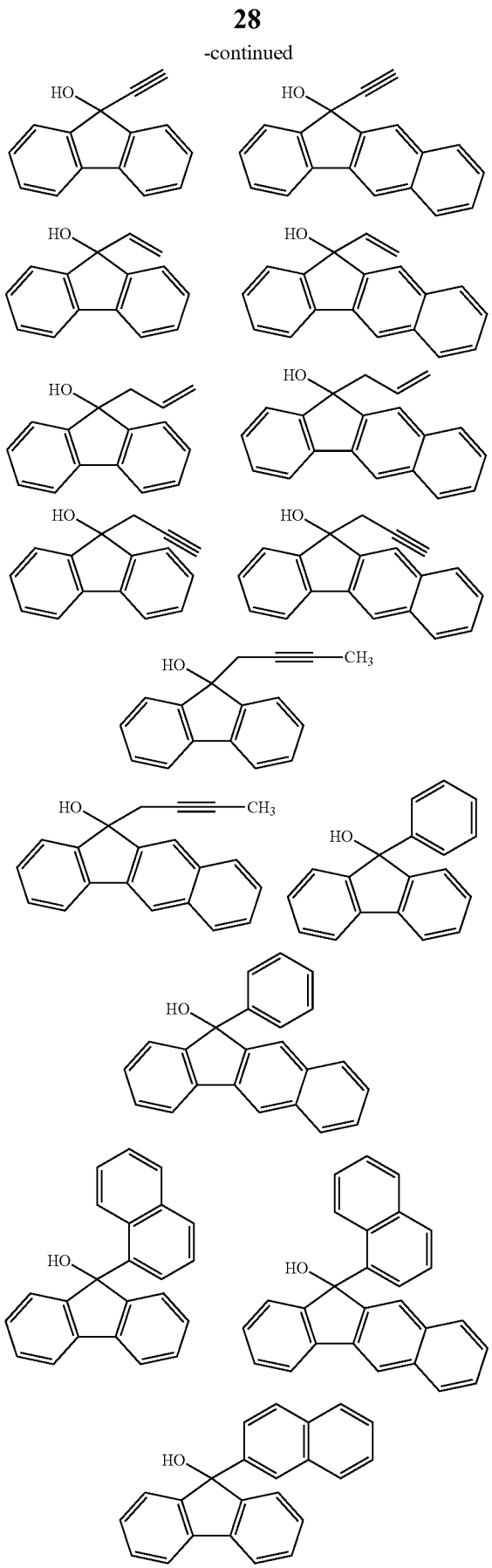

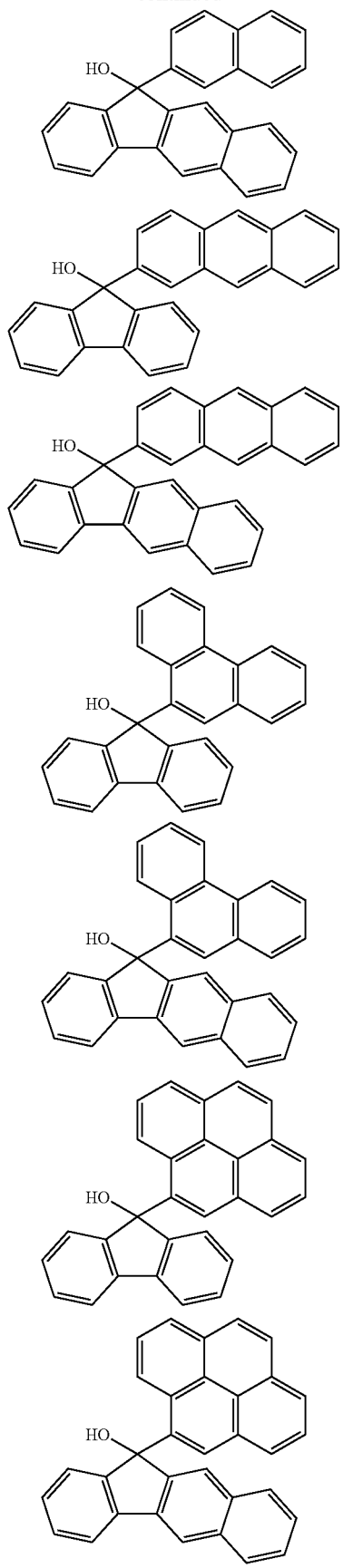
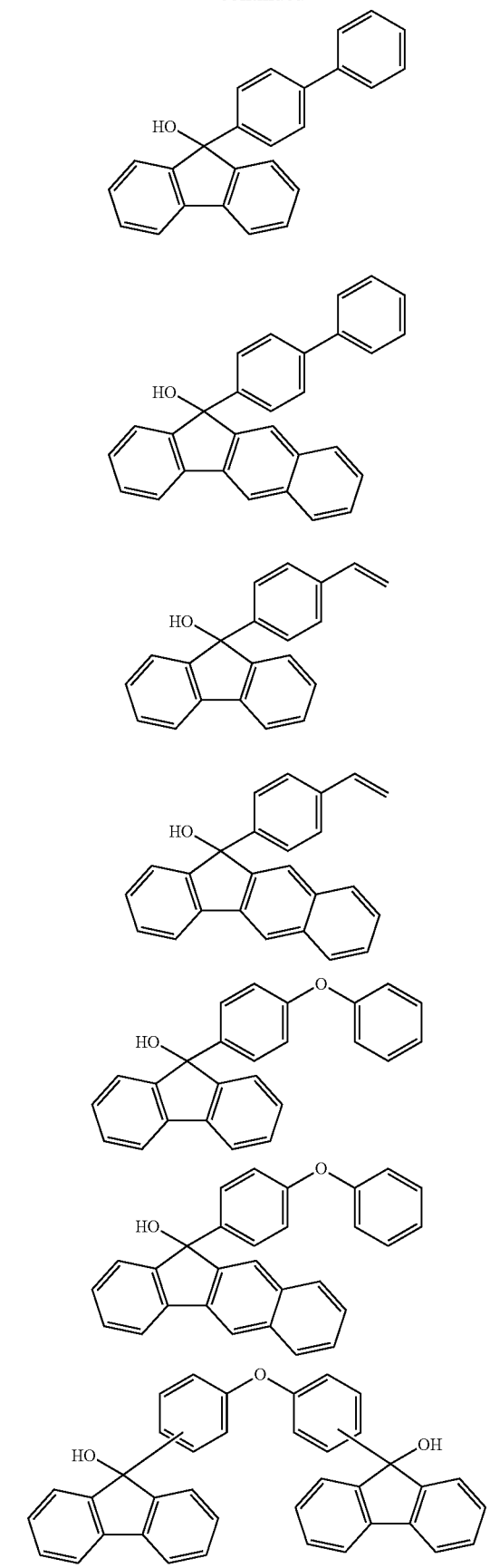

31
-continued
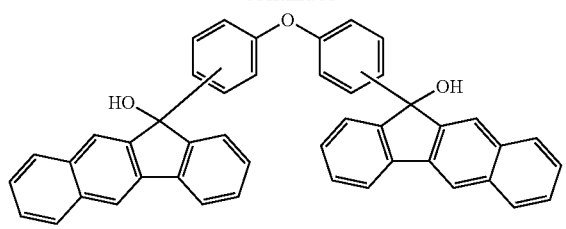
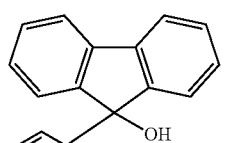
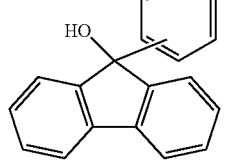
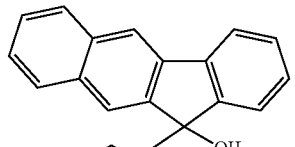
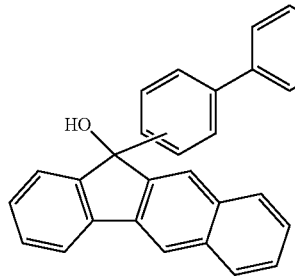
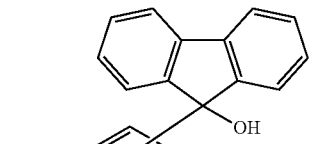
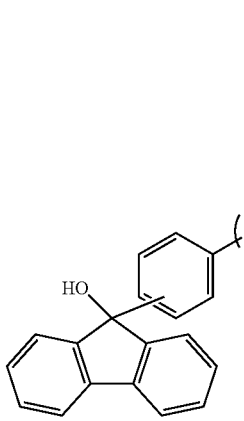
32
-continued
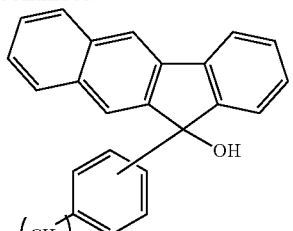
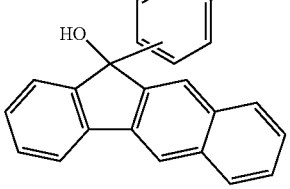
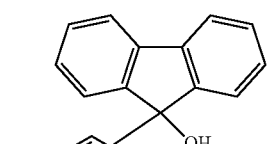
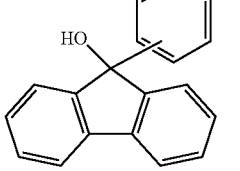
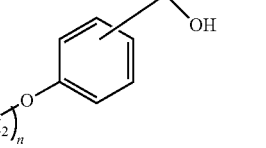
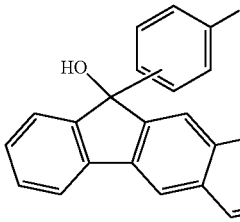

-continued
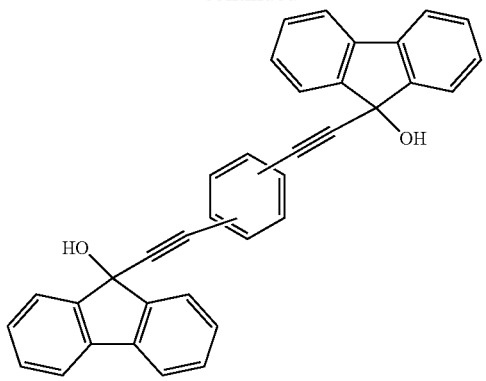
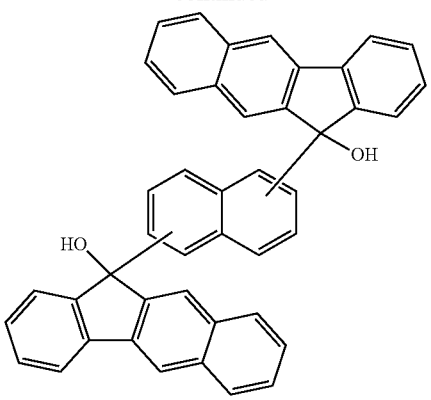

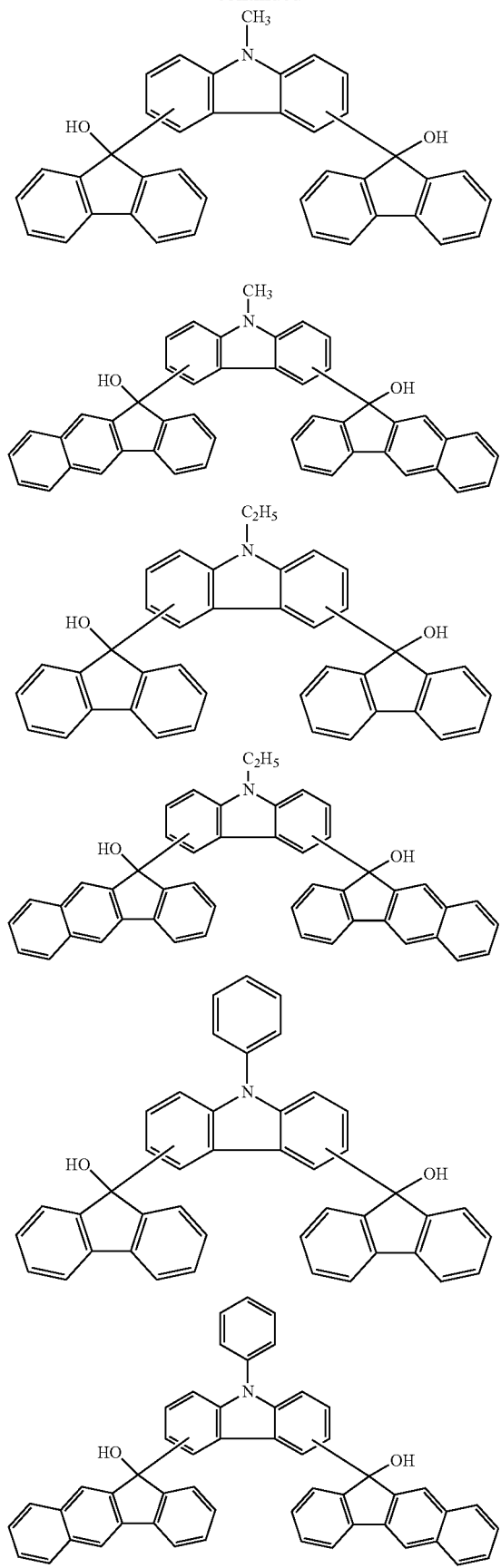

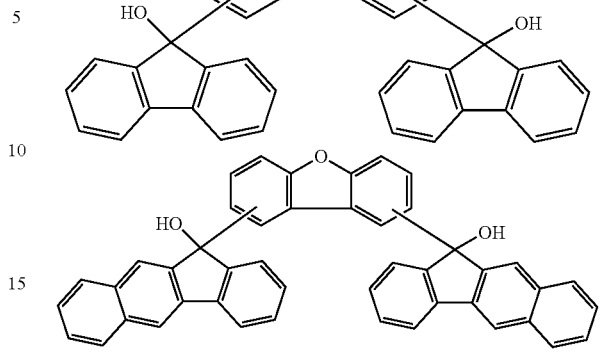

The organic solvent used in the liquid separation and washing is not particularly limited, as long as it is capable of dissolving the target product and being separated into two layers when mixed with water. Examples of the organic solvent include hydrocarbons such as hexane, heptane, benzene, toluene, and xylene; esters such as ethyl acetate, n-butyl acetate, and propylene glycol methyl ether acetate; ketones such as methyl ethyl ketone, methyl amyl ketone, cyclohexanone, and methyl isobutyl ketone; ethers such as diethyl ether, diisopropyl ether, methyl-tert-butyl ether, and ethylcyclopentylmethyl ether; chlorinated solvents such as methylene chloride, chloroform, dichloroethane, and trichloroethylene; mixtures thereof; and the like. As the water used for washing in this event, generally, what is called deionized water or ultrapure water may be used. The washing may be performed once or more, preferably approximately once to five times, because washing ten times or more does not always produce the full washing effects thereof.

In the liquid separation and washing, the washing may be performed with a basic aqueous solution to remove acidic components in the system. Specific examples of the base include hydroxides of alkaline metals, carbonates of alkaline metals, hydroxides of alkali earth metals, carbonates of alkali earth metals, ammonia, organic ammonium, etc.

Further, in the liquid separation and washing, the washing may be performed with an acidic aqueous solution to remove metal impurities or basic components in the system. Specific examples of the acid include inorganic acids such as hydrochloric acid, hydrobromic acid, sulfuric acid, nitric acid, phosphoric acid, and heteropoly acid; organic acids such as oxalic acid, fumaric acid, maleic acid, trifluoroacetic acid, methanesulfonic acid, benzenesulfonic acid, p-toluenesulfonic acid, and trifluoromethanesulfonic acid; etc.

The liquid separation and washing may be performed with any one of the basic aqueous solution and the acidic aqueous solution, or can be performed with a combination of the two. The liquid separation and washing is preferably performed with the basic aqueous solution and the acidic aqueous solution in this order from the viewpoint of removing the metal impurities.

After the liquid separation and washing with the basic aqueous solution and/or acidic aqueous solution, washing with neutral water may be successively performed. This washing may be performed once or more, preferably approximately once to five times. As the neutral water, deionized water, ultrapure water, or the like mentioned above may be used. The washing may be performed once or more, but if the washing is not performed sufficiently, the basic components and the acidic components may not be removed in some cases. The washing is performed preferably approximately once to five times because washing ten times or more does not always produce the full washing effects.

Further, the reaction product after the liquid separation operation can also be collected as a powder by concentrating and drying the solvent or crystallizing the reaction product under reduced pressure or normal pressure. Alternatively, the reaction product can be retained in a solution state with an appropriate concentration to improve the workability in preparing an organic film composition. The concentration at this point is preferably 0.1 to 50 mass %, more preferably 0.5 to 30 mass %. With such a concentration, the viscosity is hardly increased, making it possible to prevent degradation of the workability; in addition, since the amount of the solvent is not excessive, the solution can be prepared economically.

The solvent in this event is not particularly limited, as long as it is capable of dissolving the polymer. Specific examples of the solvent include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. One of these or a mixture of two or more thereof can be used.

[Polymer Production Method 2]

Further, as an alternative method for obtaining the polymer to be used in the inventive composition for forming an organic film, the polymer can also be obtained by a method as follows: first, an intermediate is obtained by polymerization using a diol having hydrogen atoms as R's or using this diol and W1 (Step 1); then, the hydrogen atoms are substituted with given R's by substitution reaction (Step 2). In the following schemes, AR1, AR2, W1, and R are as defined above.

[Step 1]

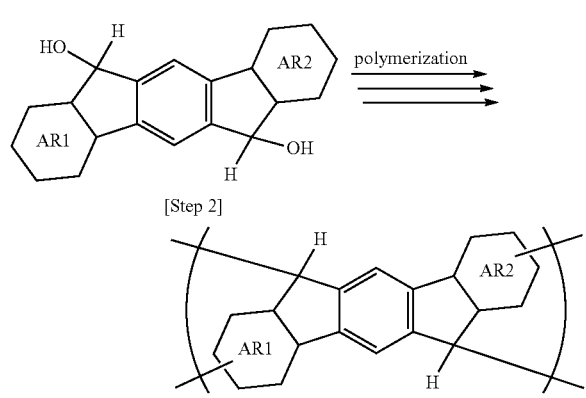

[Step 2]

[Step 1]

[Step 2]

These reactions are not particularly limited, as long as desired substituent(s) can be introduced. Examples of the reactions include a substitution reaction using a halide, tosylate, or mesylate of R and a base catalyst; and other methods. In the following schemes, X represents a halogen, a tosyl group, or a mesyl group.

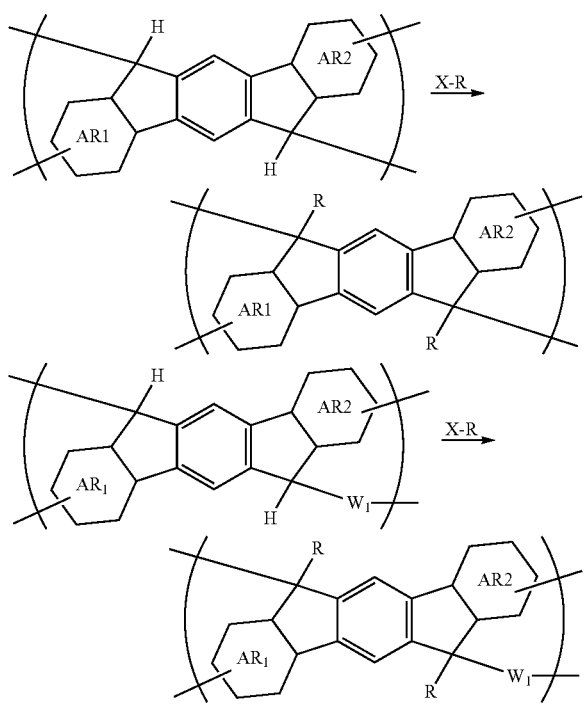

Examples of the base catalyst in the substitution reaction include inorganic base compounds such as sodium hydrogen carbonate, sodium carbonate, potassium carbonate, calcium carbonate, cesium carbonate, sodium hydroxide, potassium hydroxide, sodium hydride, and potassium phosphate; organic amine compounds such as triethylamine, pyridine, and N-methylmorpholine; etc. One of these may be used alone, or a combination of two or more thereof can be used.

The solvent used in this event is not particularly limited, as long as the solvent is inactive in the reaction. Examples of the solvent include ether-based solvents such as diethyl ether, tetrahydrofuran, and dioxane; aromatic solvents such as benzene, toluene, and xylene; acetonitrile, dimethylsulfoxide, N,N-dimethylformamide, N-methylpyrrolidone, water, etc. One of these can be used alone, or a mixture thereof can be used.

The reaction method for the polymer and the method for collecting the compound are the same as the reaction and collection methods in Polymer Production Method 1.

In the preparation for the polymer obtained according to these methods for use in a composition for forming an organic film, one kind of various halides, tosylates, and mesylates can be used alone, or combination of two or more kinds thereof can be used, depending on the required performances. For example, compounds having a side chain structure for improving planarizing property, a rigid aromatic ring structure for improving etching resistance and heat resistance, or the like can be combined at a certain ratio. Therefore, these enable the compositions for forming an organic film using these polymers to achieve all of filling and planarizing properties and etching resistance at high levels.

As described above, the inventive polymer enables the composition for forming an organic film to exhibit high etching resistance and excellent twisting resistance.

[Composition for Forming Organic Film]

The present invention provides a composition for forming an organic film, containing: the polymer having a partial structure shown by the general formula (1A) as a repeating unit; and an organic solvent. Note that, in the inventive composition for forming an organic film, one kind of the inventive polymer can be used alone, or a combination of two or more kinds thereof can be used.

<Modifier>

The inventive composition for forming an organic film may be further blended with a modifier such as a blendable compound or another polymer. The modifier mixed with the inventive composition for forming an organic film serves to improve the film-formability by spin coating and the filling property for a stepped substrate. Examples of such a modifier include novolak resins of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene) bisphenol, 2,2'difluoro-4,4'-(9H-fluorene-9-ylidene) bisphenol, 2,2'diphenyl-4,4'-(9H-fluorene-9-ylidene) bisphenol, 2,2'dimethoxy-4,4'-(9H-fluorene-9-ylidene) bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc.; and polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, poly(meth)acrylate, and copolymers thereof. It is also possible to blend a naphthol dicyclopentadiene copolymer disclosed in JP 2004-205685 A, a fluorene bisphenol novolak resin disclosed in JP 2005-128509 A, an acenaphthylene copolymer disclosed in JP 2005-250434 A, fullerene having a phenol group disclosed in JP 2006-227391 A, a bisphenol compound and a novolak resin thereof disclosed in JP 2006-293298 A, a novolak resin of an adamantane phenol compound disclosed in JP 2006-285095 A, a bisnaphthol compound and a novolak resin thereof disclosed in JP 2010-122656 A, a fullerene resin compound disclosed in JP 2008-158002 A, etc. The modifier is blended in an amount of preferably 0 to 1,000 parts by mass, more preferably 0 to 500 parts by mass, based on 100 parts by mass of the inventive polymer.

<Organic Solvent>

The organic solvent usable in the inventive composition for forming an organic film is not particularly limited, as long as the organic solvent is capable of dissolving constituent components contained in materials such as the polymer, an acid generator, a crosslinking agent, and other additives. Specifically, a solvent having a boiling point of lower than 180° C. can be used, such as solvents disclosed in paragraphs (0091) to (0092) of JP 2007-199653 A. Above all, it is preferable to use propylene glycol monomethyl ether acetate, propylene glycol monomethyl ether, 2-heptanone, cyclopentanone, cyclohexanone, and a mixture of two or more thereof.

Such a composition for forming an organic film can be applied by spin coating. Since the inventive polymer is incorporated, the composition for forming an organic film has all of favorable dry etching resistance, heat resistance, and high filling and planarizing properties.

Further, in the inventive composition for forming an organic film, it is also possible to add, as a component of the organic solvent, a high-boiling-point solvent having a boiling point of 180° C. or higher to the above-described solvent having a boiling point of lower than 180° C. (a mixture of the solvent having a boiling point of lower than 180° C. and the solvent having a boiling point of 180° C. or higher). The high-boiling-point organic solvent is not particularly limited to hydrocarbons, alcohols, ketones, esters, ethers, chlorinated solvents, and so forth, as long as the high-boiling-point organic solvent is capable of dissolving the inventive polymer. Specific examples of the high-boiling-point organic solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, dibutyl adipate, etc. One of these may be used alone, or a mixture thereof may be used.

The boiling point of the high-boiling-point solvent may be appropriately selected according to the temperature at which the composition for forming an organic film is heated. The boiling point of the high-boiling-point solvent to be added is preferably 180° C. to 300° C., further preferably 200° C. to 300° C. Such boiling points prevent the evaporation rate at baking (heating) from becoming excessive, which would otherwise occur if the boiling point is too low. Thus, sufficient thermal flowability can be obtained. Meanwhile, the boiling points are not too high, so that the high-boiling-point solvent evaporates after baking and does not remain in the film. Thus, the film properties such as etching resistance are not affected.

When the high-boiling-point solvent is used, the high-boiling-point solvent is blended in an amount of preferably 1 to 30 parts by mass based on 100 parts by mass of the solvent having a boiling point of lower than 180° C. The high-boiling-point solvent in such a formulation amount prevents a failure in providing sufficient thermal flowability during baking, which would otherwise occur if the amount is too small; in addition, degradation of the film properties such as etching resistance is prevented, which would otherwise occur if the amount is so large that the high-boiling-point solvent remains in the organic film.

In such a composition for forming an organic film, the inventive polymer is provided with thermal flowability by adding the high-boiling-point solvent, so that the composition has both high filling and planarizing properties.

<Acid Generator>

In the inventive composition for forming an organic film, an acid generator can be added so as to further promote the curing reaction. The acid generator includes a material that generates an acid by thermal decomposition, and a material that generates an acid by light irradiation. Any acid generator can be added. Specifically, materials disclosed in paragraphs (0061) to (0085) of JP 2007-199653 A can be added, but the present invention is not limited thereto.

One kind of the acid generator or a combination of two or more kinds thereof can be used. When the acid generator is added, the amount is preferably 0.05 to 50 parts by mass, more preferably 0.1 to 10 parts by mass, based on 100 parts by mass of the inventive polymer.

<Surfactant>

To the inventive composition for forming an organic film, a surfactant can be added so as to improve the coating property in spin coating. As the surfactant, for example, those disclosed in (0142) to (0147) of JP 2009-269953 A can be used.

<Crosslinking Agent>

Moreover, to the inventive composition for forming an organic film, a crosslinking agent can also be added so as to increase the curability and to further suppress intermixing with a film formed thereon. The crosslinking agent is not particularly limited, and known various types of crosslinking agents can be widely used. Examples thereof include melamine-based crosslinking agents, glycoluril-based crosslinking agents, benzoguanamine-based crosslinking agents, urea-based crosslinking agents, β-hydroxyalkylamide-based crosslinking agents, isocyanurate-based crosslinking agents, aziridine-based crosslinking agents, oxazoline-based crosslinking agents, and epoxy-based crosslinking agents.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the β-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidenebis(4-benzyl-2-oxazoline), 2,2'-isopropylidenebis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

<Plasticizer>

Further, to the inventive composition for forming an organic film, a plasticizer can be added so as to further improve the planarizing and filling properties. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A.

<Thermo-Decomposable Polymer>

Further, like the plasticizer, as an additive for imparting the filling and planarizing properties to the inventive composition for forming an organic film, it is preferable to use, for example, liquid additives having polyethylene glycol or polypropylene glycol structure, or thermo-decomposable polymers having a weight loss ratio between 30° C. and 250° C. of 40 mass % or more and a weight-average molecular weight of 300 to 200,000. The thermo-decomposable polymers preferably contain a repeating unit having an acetal structure shown by the following general formula (DP1) or (DP1a).

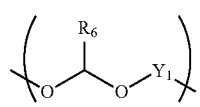

(DP1)

In the formula, $R_6$ represents a hydrogen atom or a saturated or unsaturated monovalent organic group having 1 to 30 carbon atoms which may be substituted. $Y_1$ represents a saturated or unsaturated divalent organic group having 2 to 30 carbon atoms.

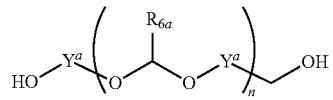

(DP1a)

In the formula, $R_{6a}$ represents an alkyl group having 1 to 4 carbon atoms. $Y^a$ represents a saturated or unsaturated divalent hydrocarbon group having 4 to 10 carbon atoms which may have an ether bond. "n" represents an average repeating unit number of 3 to 500.

Note that one kind of the inventive composition for forming an organic film can be used, or two or more kinds thereof can be used in combination. The inventive composition for forming an organic film can be used as a planarizing material for manufacturing a semiconductor device.

Moreover, the inventive composition for forming an organic film is quite useful as an organic film material for multilayer resist processes such as a two-layer resist process, a three-layer resist process using a silicon-containing resist underlayer film, and a four-layer resist process using an inorganic hard mask and an organic antireflective coating.

[Method for Forming Organic Film]

The above-described composition for forming an organic film is used to form an organic film which can serve as an organic film in a multilayer resist film used in lithography or a planarizing film for manufacturing a semiconductor.

In a method for forming an organic film as described above, a substrate to be processed is coated with the composition for forming an organic film by a spin coating method etc. By employing a method like spin coating method, favorable filling property can be obtained. After the spin coating, baking (heating) is performed to evaporate the solvent and to promote the crosslinking reaction, thereby preventing the mixing with a resist upper layer film or a resist underlayer film. The baking is preferably performed at 100° C. or more and 600° C. or less within 10 to 600 seconds, more preferably at 200° C. or more and 500° C. or less within 10 to 300 seconds. In considering the influences of device damage and wafer deformation, the upper limit of the heating temperature in lithographic wafer process is preferably 600° C. or less, more preferably 500° C. or less.

Moreover, in the method for forming an organic film, after a substrate to be processed is coated with the inventive composition for forming an organic film by the spin coating method or the like as described above, an organic film can be formed by curing the inventive composition for forming an organic film by baking in an atmosphere with an oxygen concentration of 0.1% or more and 21% or less.

A sufficiently cured organic film can be obtained by baking the inventive composition for forming an organic film in such an oxygen atmosphere. The atmosphere during the baking may be in air. Nevertheless, it is preferable to introduce an inert gas such as $N_2$, Ar, or He to reduce oxygen amount from the viewpoint of preventing oxidation of the organic film. To prevent the oxidation, the oxygen concentration needs to be controlled, and is preferably 1000 ppm or less, more preferably 100 ppm or less. Preventing the oxidation of the organic film during baking is preferable because an increase in absorption and a decrease in etching resistance are prevented.

The method for forming an organic film makes it possible to obtain a flat organic film regardless of unevenness of a substrate to be processed, because of the excellent filling and planarizing properties. Accordingly, the method is quite useful in forming a flat organic film on a substrate to be processed which has a structure or step with a height of 30 nm or more.

Note that the thickness of the organic film such as a resist underlayer film or a planarizing film for manufacturing a semiconductor device is appropriately determined and preferably 30 to 20,000 nm, more preferably 50 to 15,000 nm.

[Patterning Processes]

The present invention provides a patterning process according to a three-layer resist process using the composition for forming an organic film as described above. The patterning process includes steps of:

forming an organic film by using the inventive composition for forming an organic film on a body to be processed;

forming a silicon-containing resist underlayer film by using a silicon-containing resist underlayer film material on the organic film;

forming a resist upper layer film by using a photoresist composition on the silicon-containing resist underlayer film;

forming a circuit pattern in the resist upper layer film;

transferring the pattern to the silicon-containing resist underlayer film by etching using the resist upper layer film having the formed circuit pattern as a mask;

transferring the pattern to the organic film by etching using the silicon-containing resist underlayer film having the transferred pattern as a mask; and etching the body to be processed using the organic film having the transferred pattern as a mask to form the pattern in the body to be processed.

The silicon-containing resist underlayer film in this three-layer resist process exhibits etching resistance to an oxygen gas or a hydrogen gas. Thus, when the organic film is dry-etched using the silicon-containing resist underlayer film as a mask in the three-layer resist process, the dry etching is preferably performed using an etching gas mainly containing an oxygen gas or a hydrogen gas.

As the silicon-containing resist underlayer film in the three-layer resist process, a polysiloxane-based underlayer film is also preferably used. The silicon-containing resist underlayer film having antireflective effect can suppress the reflection. Particularly, for 193-nm light exposure, a material containing many aromatic groups and having high etching selectivity relative to the substrate is used as an organic film, so that the k-value and thus the substrate reflection are increased; in contrast, the reflection can be suppressed by imparting absorption to the silicon-containing resist underlayer film so as to have an appropriate k-value, and the substrate reflection can be reduced to 0.5% or less. As the silicon-containing resist underlayer film having antireflective effect, a polysiloxane is preferably used which has anthracene for 248-nm and 157-nm light exposure, or a phenyl group or a light-absorbing group having a silicon-silicon bond for 193-nm light exposure in a pendant structure, and which is crosslinked by an acid or heat.

An organic antireflective coating (BARC) may be formed on the silicon-containing resist underlayer film. In this case, a pattern can be formed in a body to be processed through steps of:

forming an organic film by using the inventive composition for forming an organic film on a body to be processed;

forming a silicon-containing resist underlayer film by using a silicon-containing resist underlayer film material on the organic film;

forming a BARC on the silicon-containing resist underlayer film;

forming a resist upper layer film by using a photoresist composition on the BARC;

forming a circuit pattern in the resist upper layer film;

successively transferring the pattern to the BARC and the silicon-containing resist underlayer film by etching using the resist upper layer film having the formed circuit pattern as a mask;

transferring the pattern to the organic film by etching using the silicon-containing resist underlayer film having the transferred pattern as a mask; and etching the body to be processed using the organic film having the transferred pattern as a mask to form the pattern in the body to be processed.

Alternatively, an inorganic hard mask may be formed as the resist underlayer film. In this case, a pattern can be formed in a body to be processed through steps of:

forming an organic film by using the inventive composition for forming an organic film on a body to be processed;

forming an inorganic hard mask selected from a silicon oxide film, a silicon nitride film, and a silicon oxynitride film on the organic film;

forming a resist upper layer film by using a photoresist composition on the inorganic hard mask;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

In the case where an inorganic hard mask is formed on the organic film as described above, a silicon oxide film, a silicon nitride film, and a silicon oxynitride film (SiON film) can be formed by a CVD method, an ALD method, or the like. The method for forming a silicon nitride film is disclosed in, for example, JP 2002-334869 A and WO 2004/066377 A1. The film thickness of the inorganic hard mask is preferably 5 to 200 nm, more preferably 10 to 100 nm. As the inorganic hard mask, a SiON film is most preferably used which is effective as an antireflective film. When the SiON film is formed, the substrate temperature reaches 300 to 500° C. Hence, the organic film needs to withstand the temperature of 300 to 500° C. Since the composition for forming an organic film used in the present invention has high heat resistance and can withstand high temperatures of 300° C. to 500° C., this enables the combination of the inorganic hard mask formed by a CVD method or an ALD method with the organic film formed by a spin coating method.

Moreover, the present invention is suitable for a four-layer resist process using BARC. In this case, a pattern can be formed in a body to be processed through steps of:

forming an organic film by using the inventive composition for forming an organic film on a body to be processed;

forming an inorganic hard mask selected from a silicon oxide film, a silicon nitride film, and a silicon oxynitride film on the organic film;

forming a BARC on the inorganic hard mask;

forming a resist upper layer film by using a photoresist composition on the BARC;

forming a circuit pattern in the resist upper layer film;

successively transferring the pattern to the BARC and the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

Although a photoresist film may be formed as a resist upper layer film on an inorganic hard mask, it is also possible to form a BARC on the inorganic hard mask by spin coating and then form the resist upper layer film on the BARC as described above. Particularly, when a SiON film is used as the inorganic hard mask, two antireflective films including the SiON film and the BARC make it possible to suppress the reflection even in liquid immersion exposure at a high NA exceeding 1.0. Another merit of the BARC formation is having an effect of reducing trailing of the photoresist pattern immediately above the SiON film.

The resist upper layer film in the three-layer resist process may be a positive type or a negative type, and any generally-used photoresist composition can be employed. After spin coating of the photoresist composition, pre-baking is preferably performed within ranges of 60 to 180° C. and 10 to 300 seconds. Then, light exposure, post-exposure bake (PEB), and development are performed according to conventional methods to obtain a resist pattern. Note that the thickness of the resist upper layer film is not particularly limited, but is preferably 30 to 500 nm, more preferably 50 to 400 nm.

In addition, the exposure light includes high energy beam with a wavelength of 300 nm or less; specifically, excimer laser of 248 nm, 193 nm, or 157 nm, soft X-ray of 3 to 20 nm, electron beam, X-ray, etc. Moreover, nanoimprinting, or a combination therewith can be used.

In the inventive patterning processes, a photolithography with a wavelength of 10 nm or more and 300 nm or less, direct lithography with electron beam, nanoimprinting, or a combination thereof is preferably employed as the method for forming the circuit pattern in the resist upper layer film.

Additionally, in forming the circuit pattern, the circuit pattern is preferably developed with an alkali or organic solvent.

Next, using the resulting resist pattern as a mask, etching is performed. In the three-layer resist process, the silicon-containing resist underlayer film and the inorganic hard mask are etched using a fluorocarbon-based gas and the upper layer resist pattern as the mask. Thereby, a silicon-containing resist underlayer film pattern or an inorganic hard mask pattern are formed Next, using the obtained silicon-containing resist underlayer film pattern or inorganic hard mask pattern as a mask, the organic film is processed by etching.

Subsequently, the body to be processed (e.g. substrate to be processed) can be etched according to a conventional method. For example, the substrate to be processed made of $SiO_2$, SiN, or silica low-dielectric insulating film is etched mainly with a fluorocarbon-based gas; and the substrate to be processed made of p-Si, Al, or W is etched mainly with a chlorine- or bromine-based gas. When the substrate is processed by etching with a fluorocarbon-based gas, the silicon-containing resist underlayer film pattern in the three-layer resist process is removed when the substrate is processed. Meanwhile, when the substrate is processed by etching with a chlorine- or bromine-based gas, the silicon-containing resist underlayer film pattern needs to be removed by additional dry etching with a fluorocarbon-based gas after the substrate processing.

The organic film obtained from the inventive composition for forming an organic film is characterized by excellent etching resistance when the substrate to be processed is etched as described above.

In the inventive patterning processes, as the body to be processed, it is preferable to use a semiconductor device substrate, a metal film, a metal carbide film, a metal oxide film, a metal nitride film, a metal oxycarbide film, or a metal oxynitride film.

Further, as the metal, it is preferable to use silicon, titanium, tungsten, hafnium, zirconium, chromium, germanium, cobalt, copper, silver, gold, aluminum, indium, gallium, arsenic, palladium, iron, tantalum, iridium, molybdenum, ruthenium, or an alloy thereof.

Note that the substrate to be processed is not particularly limited, and examples thereof include substrates made of Si, α-Si, p-Si, $SiO_2$, SiN, SiON, W, TiN, Al, or the like; these substrates coated with a layer to be processed; etc. Examples of the layer to be processed include various Low-k films made of Si, $SiO_2$, SiON, SiN, p-Si, α-Si, W, W—Si, Al, Cu, Al—Si, or the like; and stopper films thereof. Generally, the layer can be formed to have a thickness of preferably 50 to 10,000 nm, more preferably 100 to 5,000 nm. Note that when the layer to be processed is formed, the substrate and the layer to be processed are formed from different materials.

Furthermore, it is preferable to use the substrate to be processed which has a structure or step with a height of 30 nm or more.

Hereinbelow, an example of the three-layer resist process will be specifically described with reference to FIG. 1.

As shown in FIG. 1(A), in the three-layer resist process, an organic film 3 is formed by using the inventive composition for forming an organic film on a layer 2 to be processed which has been stacked on a substrate 1. Then, a silicon-containing resist underlayer film 4 is formed, and a resist upper layer film 5 is formed thereon.

Next, as shown in FIG. 1(B), a predetermined portion 6 of the resist upper layer film is exposed to light, followed by PEB and development to form a resist pattern 5a (FIG. 1(C)). Using the resulting resist pattern 5a as a mask, the silicon-containing resist underlayer film 4 is etched with a CF-based gas. Thereby, a silicon-containing resist underlayer film pattern 4a is formed (FIG. 1(D)). After the resist pattern 5a is removed, the organic film 3 is etched with oxygen plasma using the resulting silicon-containing resist underlayer film pattern 4a as a mask. Thereby, an organic film pattern 3a is formed (FIG. 1(E)). Further, after the silicon-containing resist underlayer film pattern 4a is removed, the layer 2 to be processed is etched using the organic film pattern 3a as a mask. Thus, a pattern 2a is formed (FIG. 1(F)).

When an inorganic hard mask is used, the inorganic hard mask is formed in place of the silicon-containing resist underlayer film 4. When a BARC is formed, the BARC layer is provided between the silicon-containing resist underlayer film 4 or the inorganic hard mask and the resist upper layer film 5. The etching of the BARC starts before the etching of the silicon-containing resist underlayer film 4, but these etchings may be performed continuously. Alternatively, after the BARC is etched alone, for example, the etching apparatus is changed, and then the etching of the silicon-containing resist underlayer film 4 may be started.

As described above, the inventive patterning processes make it possible to precisely form a fine pattern in a substrate to be processed in the multilayer resist processes.

EXAMPLE

Hereinafter, the present invention will be further specifically described by referring to Synthesis Examples, Comparative Synthesis Examples, Examples, and Comparative Examples. However, the present invention is not limited thereto. Note that, regarding molecular weight and dispersity, gel permeation chromatography (GPC) was performed using tetrahydrofuran as an eluent to determine weight-average molecular weight (Mw) and number-average molecular weight (Mn) in terms of polystyrene, and dispersity (Mw/Mn, also referred to as molecular-weight distribution) was obtained therefrom.

Synthesis Examples: Synthesis of Polymers

Polymers (A1) to (A15) were synthesized using the following Compounds B: (B1) to (B6) and Compounds C: (C1) and (C2).

Compounds B

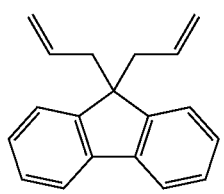
(B1)

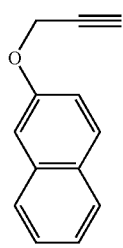
(B2)

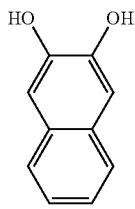
(B3)

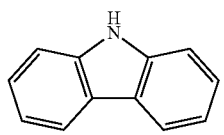
(B4)

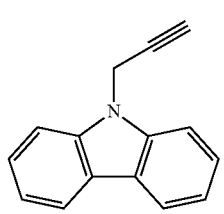
(B5)

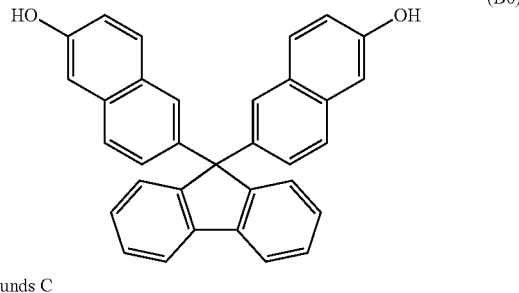
(B6)

Compounds C

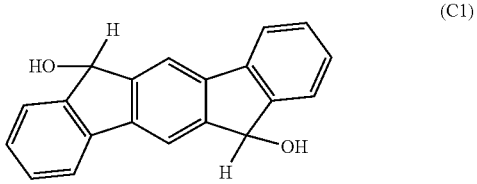
(C1)

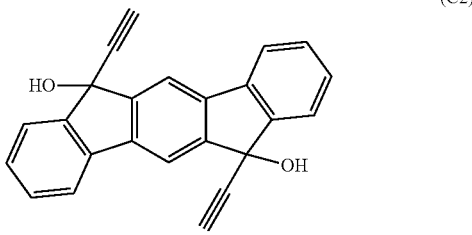
(C2)

[Synthesis Example 1] Synthesis of Polymer (A1)

Under a nitrogen atmosphere, a suspension with an inner temperature of 70° C. was prepared from 50.0 g of Compound (C1) and 300 g of 1,2-dichloroethane. Then, 33.6 g of methanesulfonic acid was slowly added thereto. After confirming that the heat generation ended, the inner temperature was raised to 70° C. for the reaction for 8 hours. After cooling to room temperature, 500 g of toluene was added, and the organic layer was washed six times with 200 g of pure water. Subsequently, the organic layer was evaporated under reduced pressure to dryness. To the residue, 150 g of tetrahydrofuran (THF) was added to form a homogeneous solution. Thereafter, the polymer was reprecipitated with 500 g of methanol. The precipitated polymer was separated by filtration, washed twice with 300 g of methanol, and collected. The collected polymer was vacuum dried at 70° C. Thus, (A1) was obtained. The weight-average molecular weight (Mw) and dispersity (Mw/Mn) thereof were determined by GPC. The results were Mw=3820 and Mw/Mn=2.63.

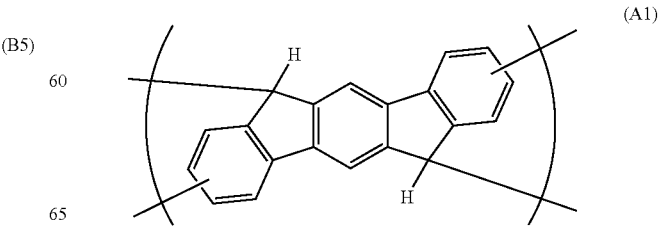
(A1)

[Synthesis Example 2] Synthesis of Polymer (A2)

Under a nitrogen atmosphere, a homogeneous dispersion with an inner temperature of 50° C. was prepared from 10.0 g of Polymer (A1) synthesized in Synthesis Example 1, 0.7 g of tetrabutylammonium iodide, 38.4 g of a 25% sodium hydroxide aqueous solution, 50 g of toluene, and 50 g of tetrahydrofuran. Then, 19.0 g of propargyl bromide was slowly added dropwise thereto, and the reaction was allowed to proceed with the inner temperature of 50° C. for 24 hours. After cooling to room temperature, 100 g of toluene was added, and the aqueous layer was removed. Further, the organic layer was washed twice with 50 g of a 3.0% nitric acid aqueous solution and five times with 50 g of pure water. The organic layer was evaporated under reduced pressure to dryness. To the residue, 40 g of THF was added, and the polymer was reprecipitated with 150 g of methanol. The precipitated polymer was separated by filtration, washed twice with 100 g of methanol, and collected. The collected polymer was vacuum dried at 70° C. Thus, (A2) was obtained. The weight-average molecular weight (Mw) and dispersity (Mw/Mn) thereof were determined by GPC. The results were Mw=4470 and Mw/Mn=2.86.

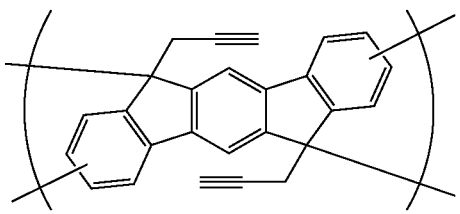

(A2)

[Synthesis Example 3] Synthesis of Polymer (A3)

Under a nitrogen atmosphere, a homogeneous dispersion with an inner temperature of 50° C. was prepared from 10.0 g of Polymer (A1) synthesized in Synthesis Example 1, 0.7 g of tetrabutylammonium iodide, 38.4 g of a 25% sodium hydroxide aqueous solution, 50 g of toluene, and 50 g of tetrahydrofuran. Then, 19.3 g of allyl bromide was slowly added dropwise thereto, and the reaction was allowed to proceed with the inner temperature of 50° C. for 24 hours. After cooling to room temperature, 100 g of toluene was added, and the aqueous layer was removed. Further, the organic layer was washed twice with 50 g of a 3.0% nitric acid aqueous solution and five times with 50 g of pure water. The organic layer was evaporated under reduced pressure to dryness. To the residue, 40 g of THF was added, and the polymer was reprecipitated with 150 g of methanol. The precipitated polymer was separated by filtration, washed twice with 100 g of methanol, and collected. The collected polymer was vacuum dried at 70° C. Thus, (A3) was obtained. The weight-average molecular weight (Mw) and dispersity (Mw/Mn) thereof were determined by GPC. The results were Mw=4260 and Mw/Mn=2.74.

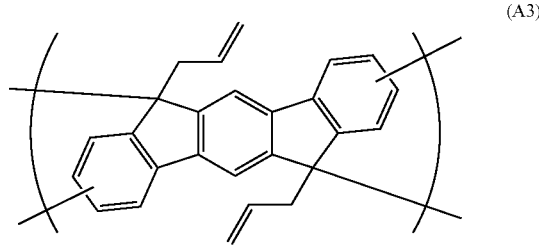

(A3)

[Synthesis Example 4] Synthesis of Polymer (A4)

Under a nitrogen atmosphere, a suspension with an inner temperature of 70° C. was prepared from 50.0 g of Compound (C2) and 300 g of 1,2-dichloroethane. Then, 28.7 g of methanesulfonic acid was slowly added thereto. After confirming that the heat generation ended, the inner temperature was raised to 70° C. for the reaction for 8 hours. After cooling to room temperature, 500 g of toluene was added, and the organic layer was washed six times with 200 g of pure water. Subsequently, the organic layer was evaporated under reduced pressure to dryness. To the residue, 150 g of THF was added to form a homogeneous solution. Thereafter, the polymer was reprecipitated with 500 g of methanol. The precipitated polymer was separated by filtration, washed twice with 300 g of methanol, and collected. The collected polymer was vacuum dried at 70° C. Thus, (A4) was obtained. The weight-average molecular weight (Mw) and dispersity (Mw/Mn) thereof were determined by GPC. The results were Mw=3980 and Mw/Mn=2.63.

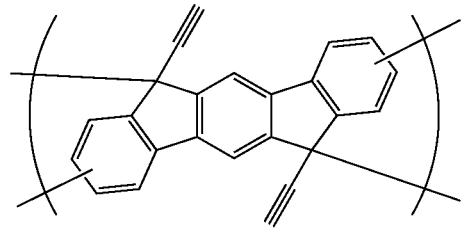

(A4)

[Synthesis Example 5] Synthesis of Polymer (A5)

Under a nitrogen atmosphere, a suspension with an inner temperature of 70° C. was prepared from 36.1 g of Compound (B1), 30.0 g of Compound (C2), and 400 g of 1,2-dichloroethane. Then, 20.1 g of methanesulfonic acid was slowly added thereto. After confirming that the heat generation ended, the inner temperature was raised to 70° C. for the reaction for 8 hours. After cooling to room temperature, 600 g of toluene was added, and the organic layer was washed six times with 200 g of pure water. Subsequently, the organic layer was evaporated under reduced pressure to dryness. To the residue, 200 g of THF was added to form a homogeneous solution. Thereafter, the polymer was reprecipitated with 600 g of methanol. The precipitated polymer was separated by filtration, washed twice with 400 g of methanol, and collected. The collected polymer was vacuum dried at 70° C. Thus, (A5) was obtained. The weight-average molecular weight (Mw) and dispersity (Mw/Mn) thereof were determined by GPC. The results were Mw=2380 and Mw/Mn=2.45.

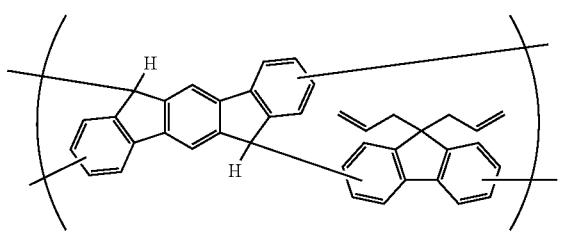

(A5)

[Synthesis Example 6] Synthesis of Polymer (A6)

Under a nitrogen atmosphere, a homogeneous dispersion with an inner temperature of 50° C. was prepared from 10.0 g of Polymer (A5) synthesized in Synthesis Example 5, 0.3 g of tetrabutylammonium iodide, 16.1 g of a 25% sodium hydroxide aqueous solution, 50 g of toluene, and 50 g of tetrahydrofuran. Then, 7.2 g of vinyl bromide was slowly added dropwise thereto, and the reaction was allowed to proceed with the inner temperature of 50° C. for 24 hours. After cooling to room temperature, 100 g of toluene was added, and the aqueous layer was removed. Further, the organic layer was washed twice with 50 g of a 3.0% nitric acid aqueous solution and five times with 50 g of pure water. The organic layer was evaporated under reduced pressure to dryness. To the residue, 40 g of THF was added, and the polymer was reprecipitated with 150 g of methanol. The precipitated polymer was separated by filtration, washed twice with 100 g of methanol, and collected. The collected polymer was vacuum dried at 70° C. Thus, (A6) was obtained. The weight-average molecular weight (Mw) and dispersity (Mw/Mn) thereof were determined by GPC. The results were Mw=2960 and Mw/Mn=2.65.

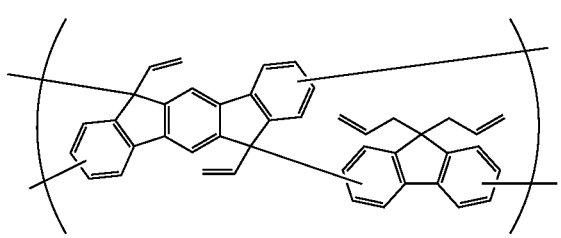

(A6)

[Synthesis Example 7] Synthesis of Polymer (A7)

Under a nitrogen atmosphere, a suspension with an inner temperature of 70° C. was prepared from 22.9 g of Compound (B2), 30.0 g of Compound (C2), and 400 g of 1,2-dichloroethane. Then, 17.2 g of methanesulfonic acid was slowly added thereto. After confirming that the heat generation ended, the inner temperature was raised to 70° C. for the reaction for 8 hours. After cooling to room temperature, 600 g of toluene was added, and the organic layer was washed six times with 200 g of pure water. Subsequently, the organic layer was evaporated under reduced pressure to dryness. To the residue, 200 g of THF was added to form a homogeneous solution. Thereafter, the polymer was reprecipitated with 600 g of methanol. The precipitated polymer was separated by filtration, washed twice with 400 g of methanol, and collected. The collected polymer was vacuum dried at 70° C. Thus, (A7) was obtained. The weight-average molecular weight (Mw) and dispersity (Mw/Mn) thereof were determined by GPC. The results were Mw=2450 and Mw/Mn=2.58.

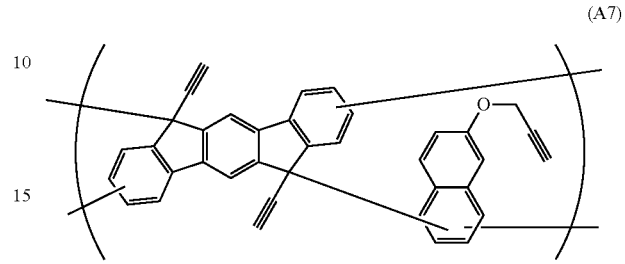

(A7)

[Synthesis Example 8] Synthesis of Polymer (A8)

Under a nitrogen atmosphere, a suspension with an inner temperature of 70° C. was prepared from 23.5 g of Compound (B3), 30.0 g of Compound (C1), and 400 g of 1,2-dichloroethane. Then, 20.1 g of methanesulfonic acid was slowly added thereto. After confirming that the heat generation ended, the inner temperature was raised to 70° C. for the reaction for 8 hours. After cooling to room temperature, 600 g of toluene was added, and the organic layer was washed six times with 200 g of pure water. Subsequently, the organic layer was evaporated under reduced pressure to dryness. To the residue, 200 g of THF was added to form a homogeneous solution. Thereafter, the polymer was reprecipitated with 600 g of methanol. The precipitated polymer was separated by filtration, washed twice with 400 g of methanol, and collected. The collected polymer was vacuum dried at 70° C. Thus, (A8) was obtained. The weight-average molecular weight (Mw) and dispersity (Mw/Mn) thereof were determined by GPC. The results were Mw=2150 and Mw/Mn=2.24.

(A8)

[Synthesis Example 9] Synthesis of Polymer (A9)

Under a nitrogen atmosphere, a homogeneous dispersion with an inner temperature of 50° C. was prepared from 10.0 g of Polymer (A8) synthesized in Synthesis Example 8, 0.7 g of tetrabutylammonium iodide, 27.0 g of a 25% sodium hydroxide aqueous solution, 50 g of toluene, and 50 g of tetrahydrofuran. Then, 22.4 g of 2-butynyl bromide was slowly added dropwise thereto, and the reaction was allowed to proceed with the inner temperature of 50° C. for 24 hours. After cooling to room temperature, 100 g of toluene was added, and the aqueous layer was removed. Further, the organic layer was washed twice with 100 g of a 5.0% nitric acid aqueous solution and five times with 50 g of pure water. The organic layer was evaporated under reduced pressure to dryness. To the residue, 40 g of THF was added, and the polymer was reprecipitated with 150 g of methanol. The precipitated polymer was separated by filtration, washed twice with 100 g of methanol, and collected. The collected polymer was vacuum dried at 70° C. Thus, (A9) was obtained. The weight-average molecular weight (Mw) and dispersity (Mw/Mn) thereof were determined by GPC. The results were Mw=3120 and Mw/Mn=2.61.

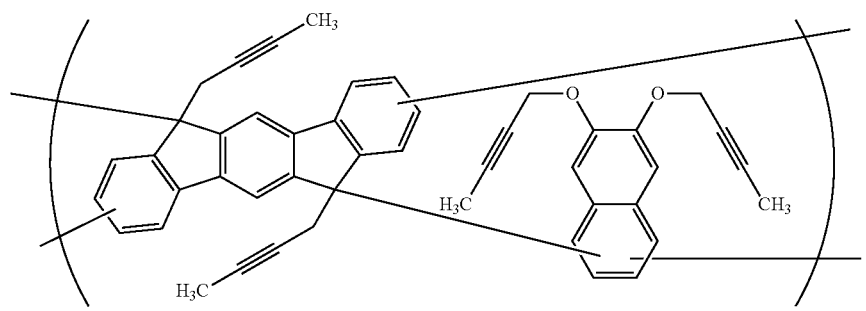

(A9)

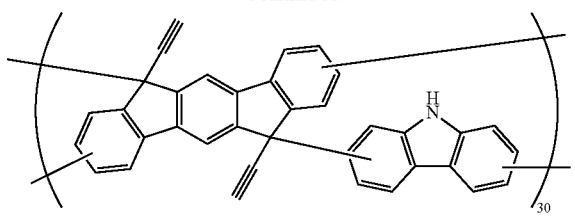

[Synthesis Example 10] Synthesis of Polymer (A10)

Under a nitrogen atmosphere, a suspension with an inner temperature of 70° C. was prepared from 17.8 g of Compound (B4), 21.0 g of Compound (C1), 10.5 g of Compound (C2), and 400 g of 1,2-dichloroethane. Then, 20.1 g of methanesulfonic acid was slowly added thereto. After confirming that the heat generation ended, the inner temperature was raised to 70° C. for the reaction for 8 hours. After cooling to room temperature, 600 g of toluene was added, and the organic layer was washed six times with 200 g of pure water. Subsequently, the organic layer was evaporated under reduced pressure to dryness. To the residue, 200 g of THF was added to form a homogeneous solution. Thereafter, the polymer was reprecipitated with 600 g of methanol. The precipitated polymer was separated by filtration, washed twice with 400 g of methanol, and collected. The collected polymer was vacuum dried at 70° C. Thus, (A10) was obtained. The weight-average molecular weight (Mw) and dispersity (Mw/Mn) thereof were determined by GPC. The results were Mw=2720 and Mw/Mn=3.11.

(A10)

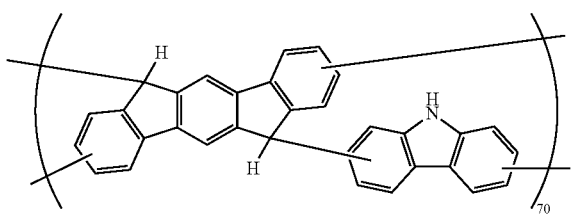

[Synthesis Example 11] Synthesis of Polymer (A11)

Under a nitrogen atmosphere, a suspension with an inner temperature of 70° C. was prepared from 29.0 g of Compound (B5), 30.0 g of Compound (C1), and 400 g of 1,2-dichloroethane. Then, 20.1 g of methanesulfonic acid was slowly added thereto. After confirming that the heat generation ended, the inner temperature was raised to 70° C. for the reaction for 8 hours. After cooling to room temperature, 600 g of toluene was added, and the organic layer was washed six times with 200 g of pure water. Subsequently, the organic layer was evaporated under reduced pressure to dryness. To the residue, 200 g of THF was added to form a homogeneous solution. Thereafter, the polymer was reprecipitated with 600 g of methanol. The precipitated polymer was separated by filtration, washed twice with 400 g of methanol, and collected. The collected polymer was vacuum dried at 70° C. Thus, (A11) was obtained. The weight-average molecular weight (Mw) and dispersity (Mw/Mn) thereof were determined by GPC. The results were Mw=2230 and Mw/Mn=2.15.

(A11)

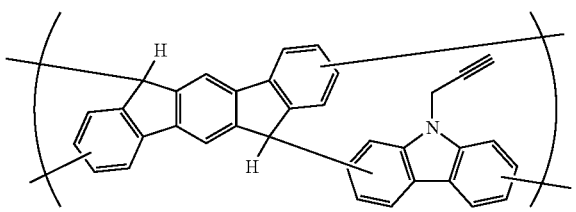

[Synthesis Example 12] Synthesis of Polymer (A12)

Under a nitrogen atmosphere, a homogeneous dispersion with an inner temperature of 50° C. was prepared from 10.0 g of Polymer (A11) synthesized in Synthesis Example 11, 0.4 g of tetrabutylammonium iodide, 12.1 g of a 25% sodium hydroxide aqueous solution, 50 g of toluene, and 50 g of tetrahydrofuran. Then, 9.2 g of allyl bromide was slowly added dropwise thereto, and the reaction was allowed to proceed with the inner temperature of 50° C. for 24 hours. After cooling to room temperature, 100 g of toluene was added, and the aqueous layer was removed. Further, the organic layer was washed twice with 50 g of a 3.0% nitric acid aqueous solution and five times with 50 g of pure water. The organic layer was evaporated under reduced pressure to dryness. To the residue, 40 g of THF was added, and the polymer was reprecipitated with 150 g of methanol. The precipitated polymer was separated by filtration, washed twice with 100 g of methanol, and collected. The collected polymer was vacuum dried at 70° C. Thus, (A12) was obtained. The weight-average molecular weight (Mw) and dispersity (Mw/Mn) thereof were determined by GPC. The results were Mw=3020 and Mw/Mn=2.43.

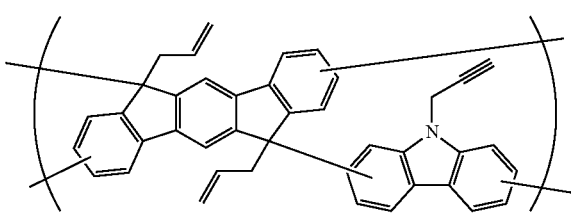

(A12)

[Synthesis Example 13] Synthesis of Polymer (A13)

Under a nitrogen atmosphere, a homogeneous dispersion with an inner temperature of 50° C. was prepared from 10.0 g of Polymer (A11) synthesized in Synthesis Example 11, 0.4 g of tetrabutylammonium iodide, 12.1 g of a 25% sodium hydroxide aqueous solution, 50 g of toluene, and 50 g of tetrahydrofuran. Then, 1.0 g of butyl bromide was slowly added dropwise thereto. In addition, after the reaction with the inner temperature of 50° C. for 8 hours, 8.1 g of propargyl bromide was slowly added dropwise, and the reaction was allowed to proceed with the inner temperature of 50° C. for 24 hours. After cooling to room temperature, 100 g of toluene was added, and the aqueous layer was removed. Further, the organic layer was washed twice with 50 g of a 3.0% nitric acid aqueous solution and five times with 50 g of pure water. The organic layer was evaporated under reduced pressure to dryness. To the residue, 40 g of THF was added, and the polymer was reprecipitated with 150 g of methanol. The precipitated polymer was separated by filtration, washed twice with 100 g of methanol, and collected. The collected polymer was vacuum dried at 70° C. Thus, (A13) was obtained. The weight-average molecular weight (Mw) and dispersity (Mw/Mn) thereof were determined by GPC. The results were Mw=3140 and Mw/Mn=2.57.

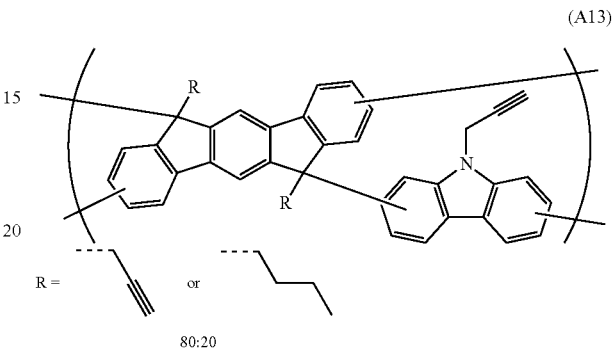

(A13)

[Synthesis Example 14] Synthesis of Polymer (A14)

Under a nitrogen atmosphere, a suspension with an inner temperature of 70° C. was prepared from 40.9 g of Compound (B6), 20.0 g of Compound (C1), and 400 g of 1,2-dichloroethane. Then, 13.4 g of methanesulfonic acid was slowly added thereto. After confirming that the heat generation ended, the inner temperature was raised to 70° C. for the reaction for 8 hours. After cooling to room temperature, 600 g of toluene was added, and the organic layer was washed six times with 200 g of pure water. Subsequently, the organic layer was evaporated under reduced pressure to dryness. To the residue, 200 g of THF was added to form a homogeneous solution. Thereafter, the polymer was reprecipitated with 600 g of methanol. The precipitated polymer was separated by filtration, washed twice with 400 g of methanol, and collected. The collected polymer was vacuum dried at 70° C. Thus, (A14) was obtained. The weight-average molecular weight (Mw) and dispersity (Mw/Mn) thereof were determined by GPC. The results were Mw=2640 and Mw/Mn=2.24.

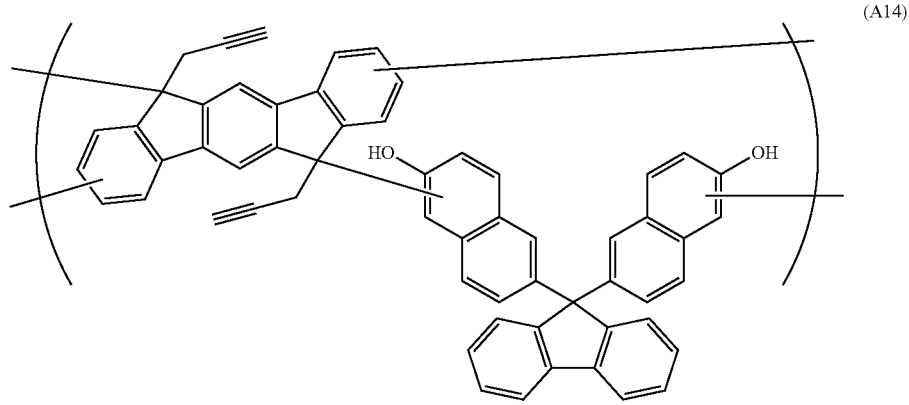

(A14)

[Synthesis Example 15] Synthesis of Polymer (A15)

Under a nitrogen atmosphere, a homogeneous dispersion with an inner temperature of 50° C. was prepared from 10.0 g of Polymer (A14) synthesized in Synthesis Example 14, 0.4 g of tetrabutylammonium iodide, 15.3 g of a 25% sodium hydroxide aqueous solution, 50 g of toluene, and 50 g of tetrahydrofuran. Then, 11.4 g of propargyl bromide was slowly added dropwise thereto, and the reaction was allowed to proceed with the inner temperature of 50° C. for 24 hours. After cooling to room temperature, 100 g of toluene was added, and the aqueous layer was removed. Further, the organic layer was washed twice with 100 g of a 5.0% nitric acid aqueous solution and five times with 50 g of pure water. The organic layer was evaporated under reduced pressure to dryness. To the residue, 40 g of THF was added, and the polymer was reprecipitated with 150 g of methanol. The precipitated polymer was separated by filtration, washed twice with 100 g of methanol, and collected. The collected polymer was vacuum dried at 70° C. Thus, (A15) was obtained. The weight-average molecular weight (Mw) and dispersity (Mw/Mn) thereof were determined by GPC. The results were Mw=3370 and Mw/Mn=2.28.

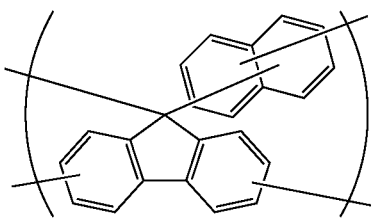

(R1)

[Comparative Synthesis Example 2] Synthesis of Compound (R2)

Under a nitrogen atmosphere, 10.0 g of indeno[1,2-b]fluorene-6,12-dione, 40.9 g of 2-naphthol, and 150 mL of 1,2-dichloroethane were added to prepare a homogeneous dispersion at 0° C. Then, a mixture solution containing 16.1 g of methanesulfonic acid and 1.3 g of 3-mercaptopropionic

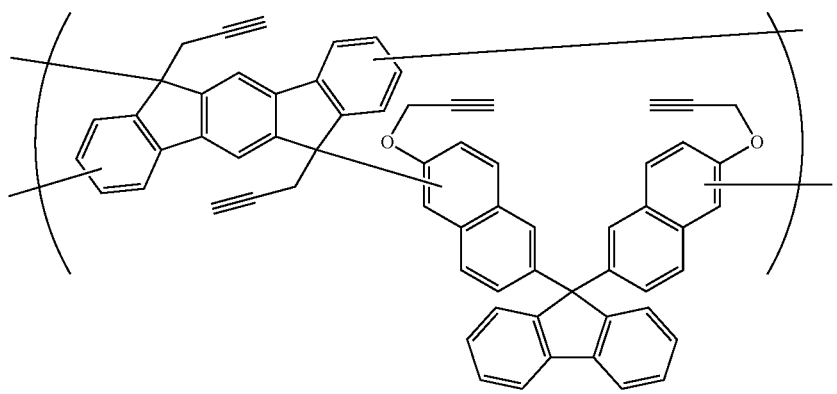

(A15)

[Comparative Synthesis Example 1] Synthesis of Polymer (R1)

Under a nitrogen atmosphere, 18.0 g of 9-fluorenone was added to 12.8 g of naphthalene, and the temperature was raised to 230° C. for the reaction for 8 hours. Immediately after the reaction started, 0.25 ml of methanesulfonic acid was added to the reaction solution once every hour, i.e., eight times in total. After cooling to room temperature, 40 g of toluene was added to the reaction solution, the resultant was washed six times with pure water, and the organic layer was evaporated under reduced pressure to dryness. To the residue, 100 g of THF (tetrahydrofuran) was added to form a homogeneous solution, followed by crystallization with 300 g of methanol. The precipitated crystal was separated by filtration, washed twice with 200 g of methanol, and collected. The collected crystal was vacuum dried at 70° C. Thus, (R1) was obtained. The weight-average molecular weight (Mw) and dispersity (Mw/Mn) thereof were determined by GPC. The results were Mw=2130 and Mw/Mn=2.61.

acid was slowly added dropwise thereto, and the reaction was allowed to proceed at 60° C. for 6 hours. After cooling to room temperature, 300 g of methyl isobutyl ketone and 100 g of pure water were added to the resultant and stirred for a while. Subsequently, the insoluble matter was separated by filtration, and the aqueous layer was removed. Further, the organic layer was washed five times with 100 g of pure water. The organic layer was evaporated under reduced pressure to dryness. To the residue, 100 g of ethyl acetate was added to form a homogeneous solution, followed by crystallization with 400 g of methanol. The precipitated crystal was separated by filtration, washed twice with 100 g of methanol, and collected. The collected crystal was vacuum dried at 70° C. Thus, (R2) was obtained. The weight-average molecular weight (Mw) and dispersity (Mw/Mn) thereof were determined by GPC. The results were Mw=860 and Mw/Mn=1.02.

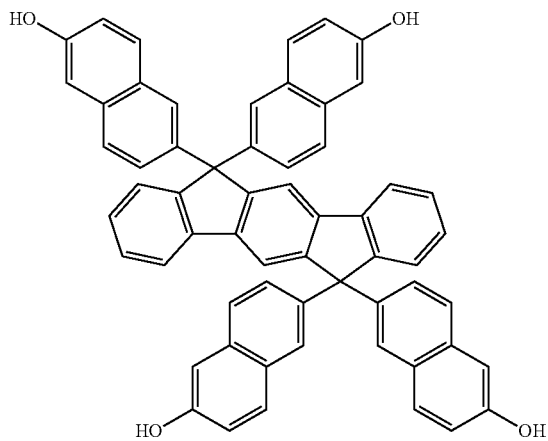

(R2)

[Comparative Synthesis Example 3] Synthesis of Polymer (R3)

Under a nitrogen atmosphere, 10.0 g of Compound (R2) synthesized in Comparative Synthesis Example 2, 0.5 g of a 37% formalin aqueous solution, and 40 g of 2-methoxy-1-propanol were added to prepare a homogeneous solution with an inner temperature of 80° C. Then, 1.0 g of a 20 wt % para-toluenesulfonic acid PGME solution was slowly added thereto, and the reaction was allowed to proceed with the inner temperature of 110° C. for 8 hours. After cooling to room temperature, 200 g of methyl isobutyl ketone was added, and the organic layer was washed five times with 50 g of pure water. Subsequently, the organic layer was evaporated under reduced pressure to dryness. To the residue, 40 g of THF was added to form a homogeneous solution. Thereafter, the polymer was reprecipitated with 100 g of hexane. The precipitated polymer was separated by filtration, washed twice with 80 g of hexane, and collected. The collected crystal was vacuum dried at 70° C. Thus, (R3) was obtained. The weight-average molecular weight (Mw) and dispersity (Mw/Mn) thereof were determined by GPC. The results were Mw=3100 and Mw/Mn=3.23.

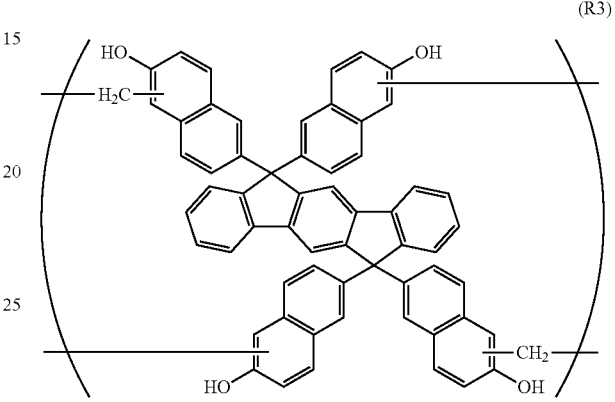

(R3)

Tables 1 and 2 show lists of the structural formulae, weight-average molecular weights (Mw), and dispersities (Mw/Mn) of the polymers and compounds obtained as described above.

TABLE 1

| Synthesis Example | Polymer or Compound | Mw | Mw/Mn |
|---|---|---|---|
| 1 | (A1) | 3820 | 2.63 |
| 2 | (A2) | 4470 | 2.86 |

TABLE 1-continued
| Synthesis Example | Polymer or Compound | Mw | Mw/Mn |
|---|---|---|---|
| 3 | 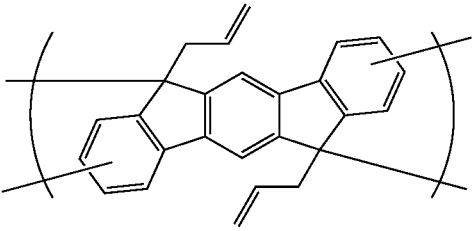(A3) | 4260 | 2.74 |
| 4 | 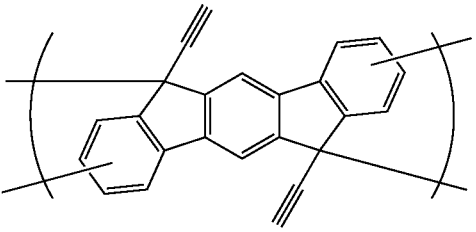(A4) | 3980 | 2.63 |
| 5 | 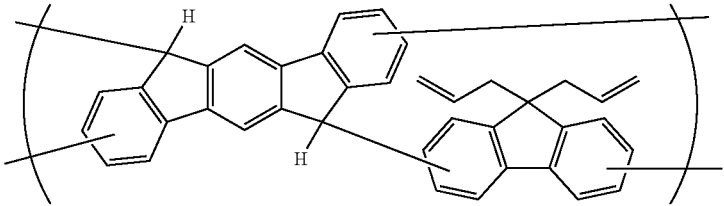(A5) | 2380 | 2.45 |
| 6 | 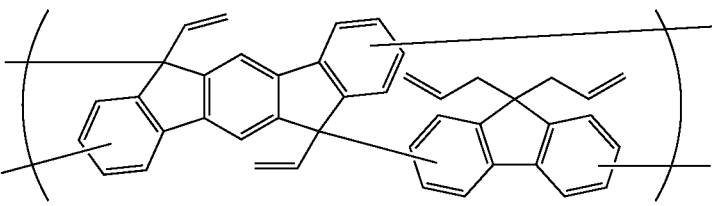(A6) | 2960 | 2.65 |
| 7 | 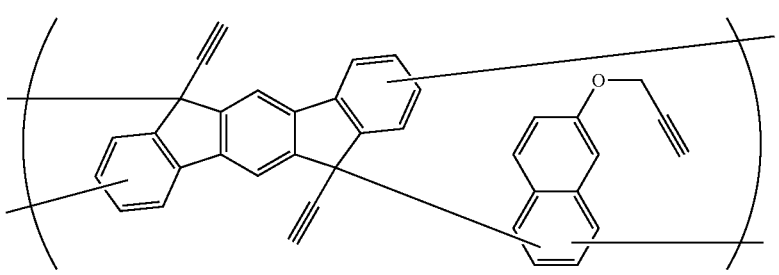(A7) | 2450 | 2.58 |

TABLE 1-continued
| Synthesis Example | Polymer or Compound | Mw | Mw/Mn |
|---|---|---|---|
| 8 | 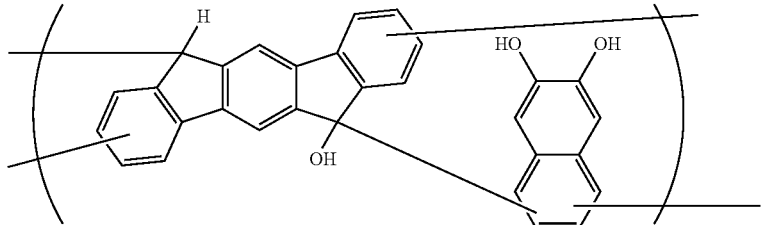<br>(A8) | 2150 | 2.24 |
| 9 | 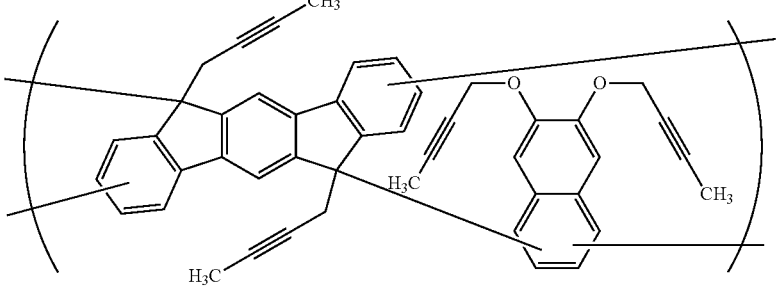<br>(A9) | 3120 | 2.61 |
| 10 | 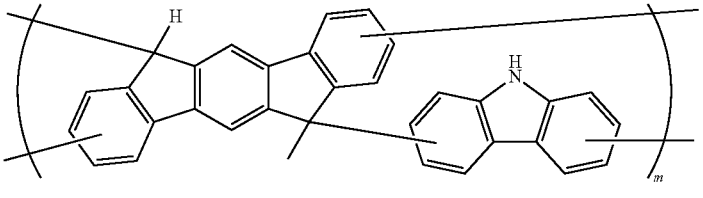<br>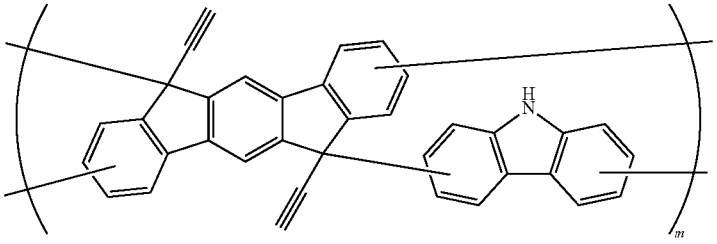<br>(A10) | 2720 | 3.11 |

TABLE 2
| Synthesis Example | Polymer or Compound | Mw | Mw/Mn |
|---|---|---|---|
| 11 | 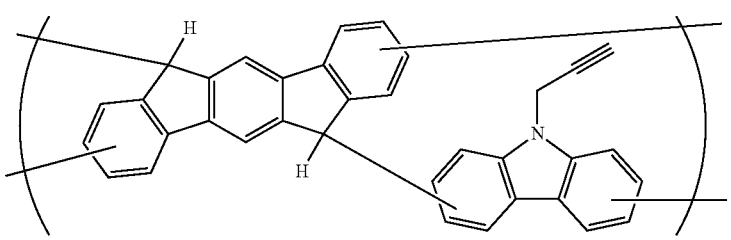<br>(A11) | 2230 | 2.15 |
| 12 | 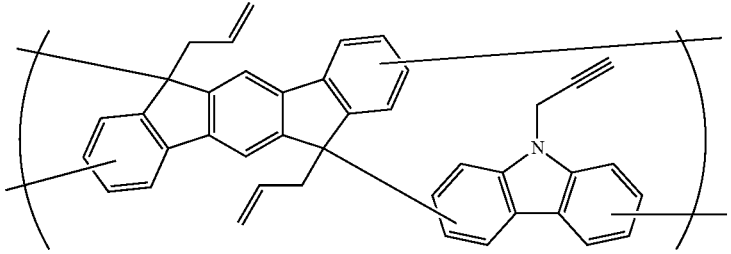<br>(A12) | 3020 | 2.43 |
| 13 | 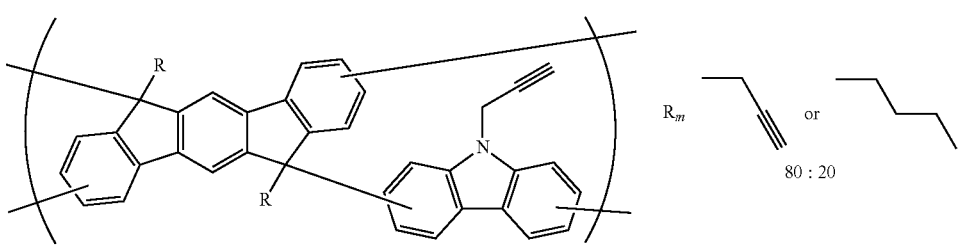<br>(A13) | 3140 | 2.57 |
| 14 | 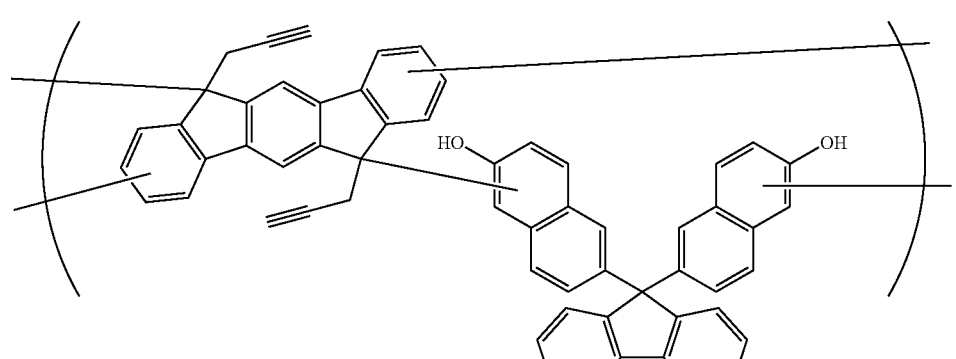<br>(A14) | 2640 | 2.24 |

TABLE 2-continued
| Synthesis Example | Polymer or Compound | Mw | Mw/Mn |
|---|---|---|---|
| 15 | 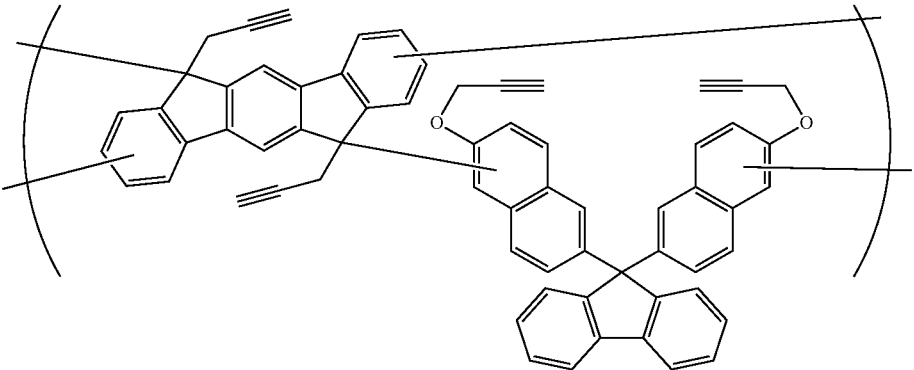 (A15) | 3370 | 2.28 |
| Comparative Synthesis Example 1 | 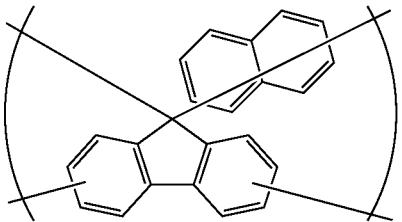 (R1) | 2130 | 2.61 |
| Comparative Synthesis Example 2 | 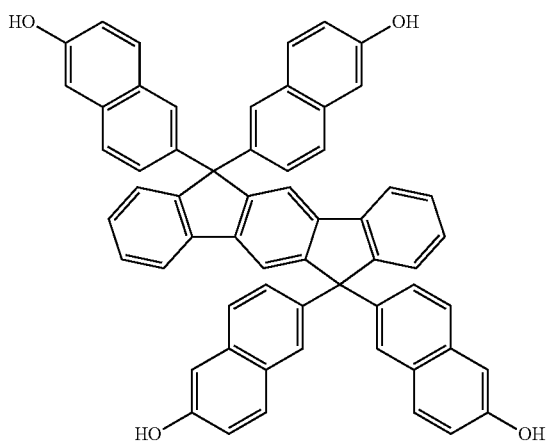 (R2) | 860 | 1.02 |

TABLE 2-continued

| Synthesis Example | Polymer or Compound | Mw | Mw/Mn |
|---|---|---|---|
| Comparative Synthesis Example 3 | (R3) | 3100 | 3.23 |

Preparation of Compositions (UDL-1 to -17, Comparative UDL-1 to -4) for Forming Organic Film Polymers or Compound (A1) to (A15) and (R1) to (R3) described above were dissolved in proportions shown in Table 3 using at least one solvent of propylene glycol monomethyl ether acetate (PGMEA) and cyclohexanone (CyHO) both of which contained 0.1 mass % FC-4430 (manufactured by Sumitomo 3M Ltd.), and optionally using a crosslinking agent (XL) and an acid generator (AG) as additives, and (S1) 1,6-diacetoxyhexane (boiling point: 260° C.) and (S2) tripropylene glycol monomethyl ether (boiling point: 242° C.) as high-boiling-point solvents. The solutions were filtered through a 0.1-μm filter made of a fluorinated resin to prepare compositions (UDL-1 to -17, Comparative UDL-1 to -4) for forming an organic film.

TABLE 3

| Composition for forming organic film | Polymer or Compound (parts by mass) | Additive (parts by mass) | High-boiling-point solvent (parts by mass) | Solvent (parts by mass) |
|---|---|---|---|---|
| UDL-1 | A1 (10) | — | — | CyHO (90) |
| UDL-2 | A2 (10) | — | — | CyHO (90) |
| UDL-3 | A3 (10) | — | — | CyHO (90) |
| UDL-4 | A4 (10) | — | — | CyHO (90) |
| UDL-5 | A5 (10) | — | — | PGMEA (45) CyHO (45) |
| UDL-6 | A6 (10) | — | — | PGMEA (45) CyHO (45) |
| UDL-7 | A7 (10) | — | — | PGMEA (45) CyHO (45) |
| UDL-8 | A8 (10) | — | — | PGMEA (90) |
| UDL-9 | A9 (10) | — | — | PGMEA (90) |
| UDL-10 | A10 (10) | — | — | PGMEA (45) CyHO (45) |
| UDL-11 | A11 (10) | — | — | PGMEA (45) CyHO (45) |
| UDL-12 | A12 (10) | — | — | PGMEA (45) CyHO (45) |
| UDL-13 | A13 (10) | — | — | PGMEA (45) CyHO (45) |
| UDL-14 | A14 (10) | — | — | PGMEA (90) |
| UDL-15 | A15 (10) | — | — | PGMEA (90) |
| UDL-16 | A1 (10) | — | S1 (10) | PGMEA (80) |
| UDL-17 | A10 (10) | — | S2 (10) | PGMEA (80) |
| Comparative UDL-1 | R1 (10) | — | — | CyHO (90) |
| Comparative UDL-2 | R1 (10) | AG (0.5) XL (0.5) | — | CyHO (90) |
| Comparative UDL-3 | R2 (10) | — | — | PGMEA (90) |
| Comparative UDL-4 | R3 (10) | — | — | PGMEA (90) |

The structural formulae of the acid generator (AG) and the crosslinking agent (XL) used in Comparative UDL-2 are shown below.

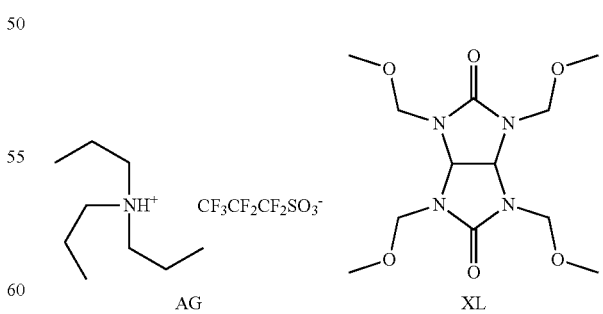

Example 1: Solvent Resistance Measurement

UDL-1 to -17 and Comparative UDL-1 to -4 thus prepared were each applied onto a silicon substrate, and baked in the atmosphere at 350° C. for 60 seconds. Then, the film thickness was measured. A PGMEA solvent was dispensed on the film and allowed to stand for 30 seconds. The resultant was spin dried and baked at 100° C. for 60 seconds to evaporate the PGMEA. The film thickness was measured to find the film thicknesses before and after the PGMEA treatment. The film thickness after the film formation and the film thickness after the PGMEA treatment were used to determine a film remaining ratio. Table 4 shows the result.

TABLE 4

| | Composition for forming organic film | Film thickness after film formation: a (Å) | Film thickness after PGMEA treatment: b (Å) | b/a × 100 (%) |
|---|---|---|---|---|
| Example 1-1 | UDL-1 | 1998 | 1994 | 99.8 |
| Example 1-2 | UDL-2 | 2007 | 2004 | 99.9 |
| Example 1-3 | UDL-3 | 2007 | 2004 | 99.9 |
| Example 1-4 | UDL-4 | 2015 | 2013 | 99.9 |
| Example 1-5 | UDL-5 | 1997 | 1992 | 99.7 |
| Example 1-6 | UDL-6 | 1986 | 1982 | 99.8 |
| Example 1-7 | UDL-7 | 2010 | 2003 | 99.7 |
| Example 1-8 | UDL-8 | 1998 | 1992 | 99.7 |
| Example 1-9 | UDL-9 | 2015 | 2011 | 99.8 |
| Example 1-10 | UDL-10 | 2014 | 2008 | 99.7 |
| Example 1-11 | UDL-11 | 2003 | 1999 | 99.8 |
| Example 1-12 | UDL-12 | 1988 | 1984 | 99.8 |
| Example 1-13 | UDL-13 | 1999 | 1995 | 99.8 |
| Example 1-14 | UDL-14 | 1991 | 1988 | 99.8 |
| Example 1-15 | UDL-15 | 1994 | 1990 | 99.8 |
| Example 1-16 | UDL-16 | 1986 | 1981 | 99.7 |
| Example 1-17 | UDL-17 | 2014 | 2008 | 99.7 |
| Comparative Example 1-1 | Comparative UDL-1 | 1998 | 1370 | 68.6 |
| Comparative Example 1-2 | Comparative UDL-2 | 2000 | 1981 | 99.1 |
| Comparative Example 1-3 | Comparative UDL-3 | 2007 | 1999 | 99.6 |
| Comparative Example 1-4 | Comparative UDL-4 | 2003 | 1997 | 99.7 |

As shown in Table 4, the film remaining percentages after the PGMEA treatment on the organic films (Examples 1-1 to 1-17) using the inventive polymers were 99% or more. This indicates that the crosslinking reaction took place by heating, and sufficient solvent resistance was exhibited. In contrast, when Polymer (R1) was used alone (Comparative UDL-1), the polymer alone had no crosslinkable moiety and did not exhibit solvent resistance. In order for solvent resistance to be exhibited, the acid generator and the crosslinking agent need to be added. These results indicate that the partial structures introduced in the inventive polymers effectively function as thermal-crosslinking groups.

Example 2: Hardness Measurement

UDL-1 to -17 and Comparative UDL-1 to -4 were each applied onto a silicon substrate and baked in the atmosphere at 350° C. for 60 seconds to form a coating film having a film thickness of 200 nm. Such films were subjected to a nano-indentation test with a SA2 nanoindenter instrument manufactured by TOYO Corporation, and the hardnesses of the coating films were measured. Table 5 shows the result.

TABLE 5

| | Composition for forming organic film | Hardness (Gpa) |
|---|---|---|
| Example 2-1 | UDL-1 | 0.75 |
| Example 2-2 | UDL-2 | 0.75 |

TABLE 5-continued

| | Composition for forming organic film | Hardness (Gpa) |
|---|---|---|
| Example 2-3 | UDL-3 | 0.76 |
| Example 2-4 | UDL-4 | 0.79 |
| Example 2-5 | UDL-5 | 0.69 |
| Example 2-6 | UDL-6 | 0.70 |
| Example 2-7 | UDL-7 | 0.75 |
| Example 2-8 | UDL-8 | 0.67 |
| Example 2-9 | UDL-9 | 0.68 |
| Example 2-10 | UDL-10 | 0.71 |
| Example 2-11 | UDL-11 | 0.71 |
| Example 2-12 | UDL-12 | 0.70 |
| Example 2-13 | UDL-13 | 0.68 |
| Example 2-14 | UDL-14 | 0.65 |
| Example 2-15 | UDL-15 | 0.68 |
| Example 2-16 | UDL-16 | 0.74 |
| Example 2-17 | UDL-17 | 0.63 |
| Comparative Example 2-1 | Comparative UDL-1 | 0.45 |
| Comparative Example 2-2 | Comparative UDL-2 | 0.48 |
| Comparative Example 2-3 | Comparative UDL-3 | 0.54 |
| Comparative Example 2-4 | Comparative UDL-4 | 0.58 |

As shown in Table 5, the hardnesses of Examples 2-1 to 2-17 were higher than those of Comparative Examples 2-1 to 2-4. This verified that the polymers of Examples 2-1 to 2-17 are capable of forming finer and stronger films than those formed from the polymers and compound used in Comparative Examples 2-1 to 2-4. The cured films of UDL-1 to -17 contain an indenofluorene structure with high carbon density, and a crosslinkable structure is introduced in every repeating unit, so that the fine films can be formed, consequently exhibiting high hardnesses. In contrast, Polymer (R1) used in Comparative Example 2-1 has high carbon density, but the polymer itself is not thermosetting. The resulting film did not have high hardness values. Moreover, although Polymer (R1) can exhibit solvent resistance by using the crosslinking agent, the crosslinking agent impairs the carbon density of the polymer. As a result, the cured films did not have high hardnesses. Although Compound (R2) used in Comparative Example 2-3 and Polymer (R3) used in Comparative Example 2-4 did not contain the crosslinking agent, the cured films were formed. However, the hardnesses were consequently lower than those of the inventive polymers as shown in Table 5.

Example 3: Etching Test

[Etching Test with CF$_4$/CHF$_3$-Based Gas]

UDL-1 to -17 and Comparative UDL-1 to -4 were each applied onto a silicon substrate and baked in the atmosphere at 350° C. for 60 seconds to form an organic film having a film thickness of 200 nm. Then, an etching test was conducted with CF$_4$/CHF$_3$-based gas under the following conditions. In this case, a dry etching apparatus TE-8500 manufactured by Tokyo Electron Limited was used to find a film thickness difference of each polymer film before and after the etching. Table 6 shows the result.

The etching conditions were as follows:

| Chamber pressure | 40.0 Pa |
| RF power | 1,000 W |
| CHF$_3$ gas flow rate | 10 ml/min |

-continued

| | |
|---|---|
| CF$_4$ gas flow rate | 100 ml/min |
| He gas flow rate | 200 ml/min |
| Time | 20 sec |

Table 6 shows the film reduction ratio in each Example and Comparative Example, given that the thickness of the Comparative UDL-1 film reduced by the etching with CF$_4$/CHF$_3$-based gas is taken as 100. The smaller the ratio, the more excellent the etching resistance.

[Etching Test with O$_2$-Based Gas]

UDL-1 to -17 and Comparative UDL-1 to -4 were each applied onto a silicon substrate and baked in the atmosphere at 350° C. for 60 seconds to form an organic film having a film thickness of 200 nm. An etching test was conducted with O$_2$-based gas under the following conditions. In this case, a dry etching apparatus TE-8500 manufactured by Tokyo Electron Limited was used to find a film thickness difference of each polymer film before and after the etching. Table 6 also shows this result.

The etching conditions were as follows:

| | |
|---|---|
| Chamber pressure | 40.0 Pa |
| RF power | 100 W |
| O$_2$ gas flow rate | 30 ml/min |
| N$_2$ gas flow rate | 70 ml/min |
| Time | 60 sec |

As in the case of the etching test with CF$_4$/CHF$_3$-based gas, Table 6 shows the film reduction ratio in each Example and Comparative Example, given that the thickness of the Comparative UDL-1 film reduced by the etching with O$_2$-based gas is taken as 100. The smaller the ratio, the more excellent the etching resistance.

TABLE 6

| Composition for forming organic film | | Etching test with CF$_4$/CHF$_3$-based gas | | Etching test with O$_2$-based gas | |
|---|---|---|---|---|---|
| | | Film thickness reduction amount (Å) | Film reduction ratio with Comparative Example 2-1 taken as 100% | Film thickness reduction amount (Å) | Film reduction ratio with Comparative Example 2-1 taken as 100% |
| Example 3-1 | UDL-1 | 794 | 88% | 1115 | 88% |
| Example 3-2 | UDL-2 | 811 | 90% | 1140 | 90% |
| Example 3-3 | UDL-3 | 794 | 88% | 1126 | 89% |
| Example 3-4 | UDL-4 | 790 | 88% | 1120 | 88% |
| Example 3-5 | UDL-5 | 815 | 91% | 1148 | 90% |
| Example 3-6 | UDL-6 | 817 | 91% | 1158 | 91% |
| Example 3-7 | UDL-7 | 824 | 92% | 1170 | 92% |
| Example 3-8 | UDL-8 | 841 | 94% | 1196 | 94% |
| Example 3-9 | UDL-9 | 835 | 93% | 1184 | 93% |
| Example 3-10 | UDL-10 | 830 | 92% | 1170 | 92% |
| Example 3-11 | UDL-11 | 818 | 91% | 1161 | 91% |
| Example 3-12 | UDL-12 | 821 | 91% | 1153 | 91% |
| Example 3-13 | UDL-13 | 820 | 91% | 1160 | 91% |
| Example 3-14 | UDL-14 | 848 | 94% | 1191 | 94% |
| Example 3-15 | UDL-15 | 835 | 93% | 1184 | 93% |
| Example 3-16 | UDL-16 | 798 | 89% | 1133 | 89% |
| Example 3-17 | UDL-17 | 836 | 93% | 1186 | 93% |
| Comparative Example 3-1 | Comparative UDL-1 | 898 | 100% | 1270 | 100% |
| Comparative Example 3-2 | Comparative UDL-2 | 987 | 110% | 1413 | 111% |
| Comparative Example 3-3 | Comparative UDL-3 | 927 | 103% | 1299 | 102% |
| Comparative Example 3-4 | Comparative UDL-4 | 926 | 103% | 1304 | 103% |

As shown in Table 6, the comparison between Examples 3-1 to 3-17 and Comparative Example 3-1 shows that, in both the etching tests with CF$_4$/CHF$_3$-based gas and O$_2$-based gas, the film reduction amounts after the etching were smaller than that of the Comparative UDL-1 film. This indicates that the films excellent in etching resistance were formed in Examples 3-1 to 3-17. The comparison between Comparative Examples 3-1 and 3-2 revealed that, in Comparative Example 3-2 in which the cured film was formed using the crosslinking agent, the addition of the crosslinking agent decreased the carbon content of the film and consequently impaired the etching resistance by approximately 10%. Further, the comparison between Examples 3-1 to 3-17 using the inventive polymers and Comparative Examples 3-1 to 3-4 using the polymers and compound of Comparative Synthesis Examples revealed that the film thickness reductions after the etching were suppressed in Examples 3-1 to 3-17, and the etching resistances thereof were excellent. This is because the inventive polymers formed the fine cured films with high carbon density by thermal crosslinking as suggested from the hardness measurement result.

Example 4: Pattern Etching Test

UDL-1 to -17 and Comparative UDL-1 to -4 were each applied onto a Si wafer substrate having a diameter of 300 mm on which a SiO$_2$ film with a film thickness of 200 nm had been formed. Then, an organic film was formed to have a film thickness of 200 nm after baking in the atmosphere at 350° C. for 60 seconds. A silicon-containing resist underlayer film material (SOG-1) was applied onto the organic film and baked at 220° C. for 60 seconds to form a silicon-containing resist underlayer film having a film thickness of 35 nm. A resist upper layer film material (SL resist for ArF) was applied thereon and baked at 105° C. for 60 seconds to form a resist upper layer film having a film thickness of 100 nm. A liquid immersion top coat material (TC-1) was applied onto the resist upper layer film and baked at 90° C. for 60 seconds to form a top coat having a film thickness of 50 nm.

The resist upper layer film material (monolayer resist for ArF) was prepared by: dissolving 100 parts by mass of a polymer (RP1) shown by the following formula, 6.6 parts by mass of an acid generator (PAG1) shown by the following formula, and 0.8 parts by mass of a basic compound (Amine1) shown by the following formula in 2500 parts by mass of PGMEA containing 0.1 mass % FC-430 (manufactured by Sumitomo 3M Ltd.); and filtering the solution through a 0.1-μm filter made of a fluorinated resin.

RP1
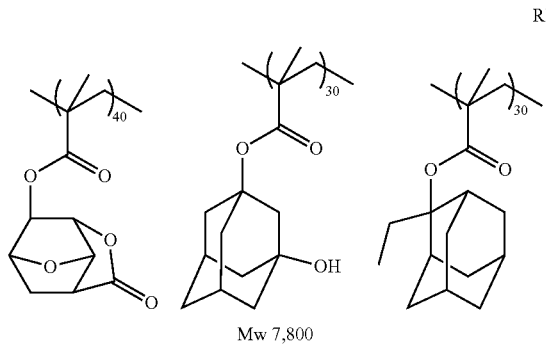
Mw 7,800

PAG1
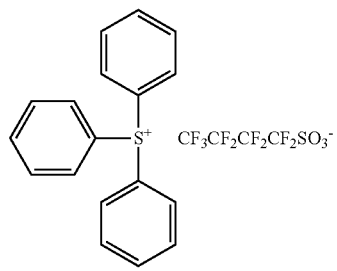

Amine1
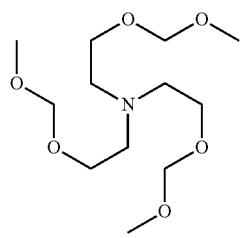

The liquid immersion top coat material (TC-1) was prepared by: dissolving 100 parts by mass of a top coat polymer (PP1) shown by the following formula in an organic solvent consisting of 2700 parts by mass of diisoamyl ether and 270 parts by mass of 2-methyl-1-butanol; and filtering the solution through a 0.1-μm filter made of a fluorinated resin.

PP1
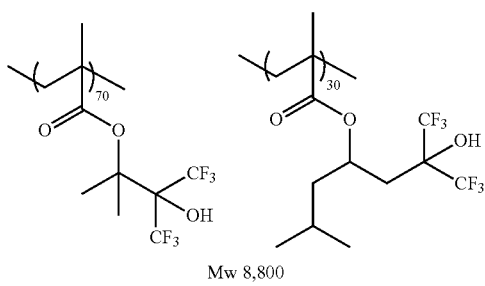
Mw 8,800

The silicon-containing resist underlayer film material (SOG-1) was prepared by: dissolving 100 parts by mass of an a polymer (SiP1) and 1 part by mass of a crosslinking catalyst (CAT1) shown by the following formulae in 4000 parts by mass of propylene glycol monoethyl ether containing 0.1 mass % FC-4430 (manufactured by Sumitomo 3M Ltd.); and filtering the solution through a filter having a pore size of 0.1 μm and made of a fluorinated resin.

SiP1
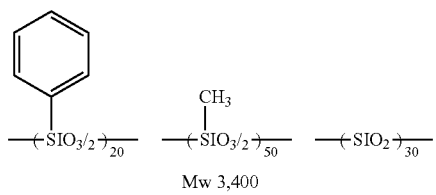
Mw 3,400

CAT1
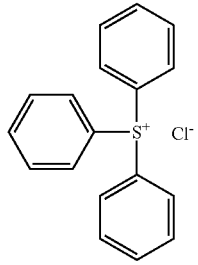

Next, the resulting substrate was exposed to light at various exposure levels with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (PEB), and developed with a 2.38 mass % tetramethylammonium hydroxide (TMAH) aqueous solution for 30 seconds. Thus, a positive line and space pattern was obtained with the resist line width ranging from 50 nm to 30 nm at a pitch of 100 nm.

Then, dry-etching processing with an etching apparatus Telius manufactured by Tokyo Electron Limited was performed successively as follows. The silicon-containing underlayer film was processed using the resist pattern as a mask; the organic film was processed using the silicon-containing underlayer film as a mask; and the SiO$_2$ film was processed using the organic film as a mask.

The etching conditions were as follows.
Conditions for Transferring the Resist Pattern to the SOG Film:

| | |
|---|---|
| Chamber pressure | 10.0 Pa |
| RF power | 1,500 W |
| $CF_4$ gas flow rate | 15 sccm |
| $O_2$ gas flow rate | 75 sccm |
| Time | 15 sec |

Transferring Conditions from the SOG Film to the Organic Film:

| | |
|---|---|
| Chamber pressure | 2.0 Pa |
| RF power | 500 W |
| Ar gas flow rate | 75 sccm |
| $O_2$ gas flow rate | 45 sccm |
| Time | 120 sec |

Transferring Conditions to the $SiO_2$ Film:

| | |
|---|---|
| Chamber pressure | 2.0 Pa |
| RF power | 2,200 W |
| $C_5F_{12}$ gas flow rate | 20 sccm |
| $C_2F_6$ gas flow rate | 10 sccm |
| Ar gas flow rate | 300 sccm |
| $O_2$ gas flow rate | 60 sccm |
| Time | 90 sec |

The pattern cross sections were observed with an electron microscope (S-4700) manufactured by Hitachi, Ltd. The profiles were compared and summarized in Table 7.

taining resist underlayer film material (SOG-1) was applied, the film was dissolved, so that no pattern was formed.

Regarding the pattern profiles after the etching in Examples 4-1 to 4-17, the resist profiles after the development and the profiles of the organic films after oxygen etching and substrate-processing etching were all favorable. In accordance with the resist line width formed by the light exposure, the pattern dimension transferred to the substrate was also changed. The patterns were twisted at the line width of approximately 40 nm in Comparative Example 4-2, and at the line width of approximately 35 nm in Comparative Examples 4-3 and 4-4. In contrast, in Examples 4-1 to 4-17 using the inventive polymers, no twisting occurred even if the line width was narrower than 35 nm. These indicate high twisting resistance. This result can also be suggested from the fact that the inventive polymers had high hardness and formed fine and high-strength organic films.

Example 5: Filling Property Evaluation

On a stepped $SiO_2$ substrate which was a $SiO_2$ substrate having a dense hole pattern with each thickness of 500 nm and each diameter of 160 nm formed therein, an organic film was formed by applying one of UDL-1 to -17 under such conditions that the film with a thickness of 80 nm was formed on a flat portion of the substrate by baking at 350° C. for 60 seconds. Each substrate having such an organic film formed thereon was split and observed with a scanning electron microscope (SEM) to check whether the holes were filled to the bottoms with the organic film. Table 8 shows the result.

TABLE 7

| | Composition for forming organic film | Pattern profile after development | Profile after etching for transferring to silicon-containing underlayer film | Profile after etching for transferring to organic film | Profile after etching for transferring to substrate | Minimum dimension (nm) without pattern twisting after etching for transferring to substrate |
|---|---|---|---|---|---|---|
| Example 4-1 | UDL-1 | vertical profile | vertical profile | vertical profile | vertical profile | 27 |
| Example 4-2 | UDL-2 | vertical profile | vertical profile | vertical profile | vertical profile | 27 |
| Example 4-3 | UDL-3 | vertical profile | vertical profile | vertical profile | vertical profile | 27 |
| Example 4-4 | UDL-4 | vertical profile | vertical profile | vertical profile | vertical profile | 26 |
| Example 4-5 | UDL-5 | vertical profile | vertical profile | vertical profile | vertical profile | 29 |
| Example 4-6 | UDL-6 | vertical profile | vertical profile | vertical profile | vertical profile | 29 |
| Example 4-7 | UDL-7 | vertical profile | vertical profile | vertical profile | vertical profile | 27 |
| Example 4-8 | UDL-8 | vertical profile | vertical profile | vertical profile | vertical profile | 30 |
| Example 4-9 | UDL-9 | vertical profile | vertical profile | vertical profile | vertical profile | 30 |
| Example 4-10 | UDL-10 | vertical profile | vertical profile | vertical profile | vertical profile | 28 |
| Example 4-11 | UDL-11 | vertical profile | vertical profile | vertical profile | vertical profile | 28 |
| Example 4-12 | UDL-12 | vertical profile | vertical profile | vertical profile | vertical profile | 29 |
| Example 4-13 | UDL-13 | vertical profile | vertical profile | vertical profile | vertical profile | 30 |
| Example 4-14 | UDL-14 | vertical profile | vertical profile | vertical profile | vertical profile | 31 |
| Example 4-15 | UDL-15 | vertical profile | vertical profile | vertical profile | vertical profile | 30 |
| Example 4-16 | UDL-16 | vertical profile | vertical profile | vertical profile | vertical profile | 27 |
| Example 4-17 | UDL-17 | vertical profile | vertical profile | vertical profile | vertical profile | 32 |
| Comparative Example 4-1 | Comparative UDL-1 | no pattern | — | — | — | — |
| Comparative Example 4-2 | Comparative UDL-2 | vertical profile | vertical profile | vertical profile | vertical profile | 42 |
| Comparative Example 4-3 | Comparative UDL-3 | vertical profile | vertical profile | vertical profile | vertical profile | 37 |
| Comparative Example 4-4 | Comparative UDL-4 | vertical profile | vertical profile | vertical profile | vertical profile | 35 |

As shown in Table 7, the results of Examples 4-1 to 4-17 revealed that when UDL-1 to -17 were used as organic films of the three-layer resists for liquid immersion lithography, the resist profiles after the development were favorable in the pattern profile evaluation. This indicates useful effect as an antireflective film. In contrast, Comparative UDL-1 used in Comparative Example 4-1 is not thermosetting, and did not attain solvent resistance. Thus, when the silicon-con-

TABLE 8

| | Composition for forming organic film | Filling property |
|---|---|---|
| Example 5-1 | UDL-1 | holes were favorably filled to bottoms |

TABLE 8-continued

| | Composition for forming organic film | Filling property |
|---|---|---|
| Example 5-2 | UDL-2 | holes were favorably filled to bottoms |
| Example 5-3 | UDL-3 | holes were favorably filled to bottoms |
| Example 5-4 | UDL-4 | holes were favorably filled to bottoms |
| Example 5-5 | UDL-5 | holes were favorably filled to bottoms |
| Example 5-6 | UDL-6 | holes were favorably filled to bottoms |
| Example 5-7 | UDL-7 | holes were favorably filled to bottoms |
| Example 5-8 | UDL-8 | holes were favorably filled to bottoms |
| Example 5-9 | UDL-9 | holes were favorably filled to bottoms |
| Example 5-10 | UDL-10 | holes were favorably filled to bottoms |
| Example 5-11 | UDL-11 | holes were favorably filled to bottoms |
| Example 5-12 | UDL-12 | holes were favorably filled to bottoms |
| Example 5-13 | UDL-13 | holes were favorably filled to bottoms |
| Example 5-14 | UDL-14 | holes were favorably filled to bottoms |
| Example 5-15 | UDL-15 | holes were favorably filled to bottoms |
| Example 5-16 | UDL-16 | holes were favorably filled to bottoms |
| Example 5-17 | UDL-17 | holes were favorably filled to bottoms |

As shown in Table 8, in all of Examples 5-1 to 5-17 in which the organic films were formed by using UDL-1 to UDL-17 of the present invention, the holes were favorably filled to the bottoms. This indicates that even when a substrate to be processed has a step(s), sufficient filling property can be expected, and the inventive compositions have useful properties as an organic film material for multilayer processes.

Example 6: Planarizing Property Evaluation

The compositions (UDL-1, -10, -16, -17, Comparative UDL-1, -3, -4) for forming an organic film were each applied onto a SiO$_2$ wafer substrate having a giant isolated trench pattern (trench width: 10 μm, trench depth: 0.10 μm), and baked in the atmosphere at 350° C. for 60 seconds. Then, a step (delta in FIG. 2) between the trench portion and the non-trench portion of the organic film was observed with an atomic force microscope (AFM) NX10 manufactured by Park systems Corp. Table 9 shows the result. In this evaluation, the smaller the step, the more favorable the planarizing property. Note that, in this evaluation, a trench pattern having a depth of 0.10 μm was generally planarized using a composition for forming an organic film with a film thickness of approximately 0.2 μm. This is a strict evaluation condition to evaluate the planarizing property.

TABLE 9

| | Composition for forming organic film | Step (nm) |
|---|---|---|
| Example 6-1 | UDL-1 | 80 |
| Example 6-2 | UDL-10 | 75 |
| Example 6-3 | UDL-16 | 70 |
| Example 6-4 | UDL-17 | 70 |
| Comparative Example 6-1 | Comparative UDL-1 | 90 |
| Comparative Example 6-2 | Comparative UDL-3 | 85 |
| Comparative Example 6-3 | Comparative UDL-4 | 90 |

As shown in Table 9, the organic films obtained from the inventive compositions for forming an organic film had smaller steps between the trench and non-trench portions than those in Comparative Examples 6-1 to 6-3. This verified that the inventive compositions are excellent in planarizing property. It is presumed that in Comparative Examples 6-1 to 6-3, the films are inferior in fineness and considerably shrunk by baking, therefore the film thickness difference between the upper portion and the lower portion of each step was emphasized by the baking, and the planarizing property was poor. Moreover, the comparison between Examples 6-3, 6-4 in which the high-boiling-point solvents were added and Examples 6-1, 6-2 without the high-boiling-point solvents shows that adding the high-boiling-point solvents improved the planarizing property.

Example 7: Coatability Test

The compositions (UDL-1 to -17 and Comparative UDL-3) for forming an organic film were applied onto each of a Bare-Si substrate, a substrate treated with hexamethyldisilazane (HMDS), and a substrate treated with SiON, which are shown in Table 10, and baked in the atmosphere at 350° C. for 60 seconds to form an organic film having a film thickness of 200 nm. The organic film thus formed was observed with an optical microscope (ECLIPSE L200 manufactured by Nikon INSTECH CO., LTD.) to check the coating abnormality. Table 10 shows the observation result.

TABLE 10

| | Composition forming organic film | Bare-Si substrate | HMDS-treated substrate | SiON-treated substrate |
|---|---|---|---|---|
| Example 7-1 | UDL-1 | no abnormality | no abnormality | no abnormality |
| Example 7-2 | UDL-2 | no abnormality | no abnormality | no abnormality |
| Example 7-3 | UDL-3 | no abnormality | no abnormality | no abnormality |
| Example 7-4 | UDL-4 | no abnormality | no abnormality | no abnormality |
| Example 7-5 | UDL-5 | no abnormality | no abnormality | no abnormality |
| Example 7-6 | UDL-6 | no abnormality | no abnormality | no abnormality |
| Example 7-7 | UDL-7 | no abnormality | no abnormality | no abnormality |
| Example 7-8 | UDL-8 | no abnormality | no abnormality | no abnormality |
| Example 7-9 | UDL-9 | no abnormality | no abnormality | no abnormality |
| Example 7-10 | UDL-10 | no abnormality | no abnormality | no abnormality |
| Example 7-11 | UDL-11 | no abnormality | no abnormality | no abnormality |
| Example 7-12 | UDL-12 | no abnormality | no abnormality | no abnormality |

TABLE 10-continued

| | Composition forming organic film | Bare-Si substrate | HMDS-treated substrate | SiON-treated substrate |
|---|---|---|---|---|
| Example 7-13 | UDL-13 | no abnormality | no abnormality | no abnormality |
| Example 7-14 | UDL-14 | no abnormality | no abnormality | no abnormality |
| Example 7-15 | UDL-15 | no abnormality | no abnormality | no abnormality |
| Example 7-16 | UDL-16 | no abnormality | no abnormality | no abnormality |
| Example 7-17 | UDL-17 | no abnormality | no abnormality | no abnormality |
| Comparative Example 7-1 | Comparative UDL-3 | no abnormality | pinhole defect | no abnormality |

As shown in Table 10, in Examples 7-1 to 7-17 in which organic films were formed using UDL-1 to UDL-17 of the present invention, uniform organic films were successfully formed without coating abnormality regardless of the substrates. In contrast, in Comparative Example 7-1, since the single-molecular compound was used, agglomeration is likely to occur depending on the substrate, so that many pinhole-like coating defects which seemed splash were observed. The use of the compositions for forming an organic film which contain the inventive polymers enables the formation of uniform coating films without substrate dependency.

From the above, the inventive composition for forming an organic film enables high etching resistance and excellent twisting resistance during etching. The inventive composition is a quite useful material of an organic film for multilayer resist processes, particularly a three-layer resist process, for ultrafine and very precise patterning.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming an organic film, comprising: a polymer having a partial structure shown by the following general formula (1A) as a repeating unit; and an organic solvent,

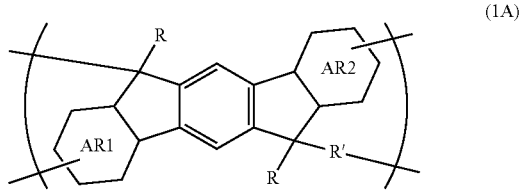

(1A)

wherein
AR1 and AR2 each represent a benzene ring or a naphthalene ring which further optionally have a substituting group that is substituting a hydrogen atom directly bonded to the benzene ring or the naphthalene ring;
each R represents a hydrogen atom or a monovalent organic group having 2 to 10 carbon atoms and an unsaturated bond;
R' represents a single bond or W1; and
W1 represents a divalent organic group having 6 to 80 carbon atoms and one or more aromatic rings.

2. The composition for forming an organic film according to claim 1, wherein the general formula (1A) is shown by the following general formula (1B),

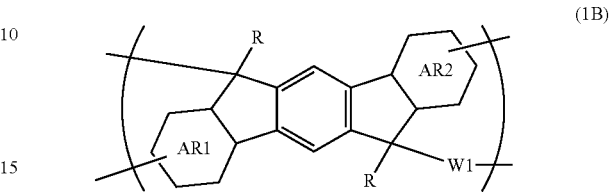

(1B)

wherein AR1, AR2, R, and W1 are as defined above.

3. The composition for forming an organic film according to claim 2, wherein each R in the general formulae (1A) and (1B) is a hydrogen atom or any structure shown in the following formula (1C),

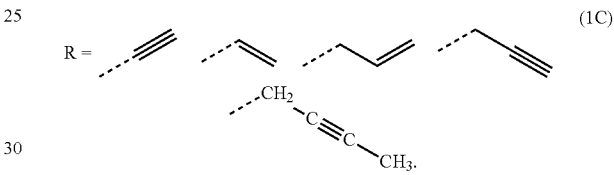

(1C)

4. The composition for forming an organic film according to claim 1, wherein the divalent organic group represented by W1 has at least any of a naphthalene ring, a fluorene ring, and a carbazole ring.

5. The composition for forming an organic film according to claim 1, wherein the polymer has a weight-average molecular weight of 1000 to 5000.

6. The composition for forming an organic film according to claim 1, wherein the organic solvent is a mixture of one or more organic solvents each having a boiling point of lower than 180° C. and one or more organic solvents each having a boiling point of 180° C. or higher.

7. The composition for forming an organic film according to claim 1, further comprising at least one of a surfactant and a plasticizer.

8. A patterning process comprising the steps of:
forming an organic film by using the composition for forming an organic film according to claim 1 on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching using the resist upper layer film having the formed circuit pattern as a mask;
transferring the pattern to the organic film by etching using the silicon-containing resist underlayer film having the transferred pattern as a mask; and
etching the body to be processed using the organic film having the transferred pattern as a mask to form the pattern in the body to be processed.

9. The patterning process according to claim 8, wherein the circuit pattern is formed in the resist upper layer film by a photolithography with a wavelength of 10 nm or more and 300 nm or less, direct lithography with electron beam, nanoimprinting, or a combination thereof.

10. The patterning process according to claim 8, wherein alkali development or organic solvent development is employed as a development method.

11. The patterning process according to claim 8, wherein the body to be processed is a semiconductor device substrate, a metal film, a metal carbide film, a metal oxide film, a metal nitride film, a metal oxycarbide film, or a metal oxynitride film.

12. The patterning process according to claim 11, wherein the metal is silicon, titanium, tungsten, hafnium, zirconium, chromium, germanium, cobalt, copper, silver, gold, aluminum, indium, gallium, arsenic, palladium, iron, tantalum, iridium, molybdenum, ruthenium, or an alloy thereof.

13. A patterning process comprising the steps of:
forming an organic film by using the composition for forming an organic film according to claim 1 on a body to be processed;
forming a silicon-containing resist underlayer film by using a silicon-containing resist underlayer film material on the organic film;
forming an organic antireflective coating (BARC) on the silicon-containing resist underlayer film;
forming a resist upper layer film by using a photoresist composition on the BARC;
forming a circuit pattern in the resist upper layer film;
successively transferring the pattern to the BARC and the silicon-containing resist underlayer film by etching using the resist upper layer film having the formed circuit pattern as a mask;
transferring the pattern to the organic film by etching using the silicon-containing resist underlayer film having the transferred pattern as a mask; and
etching the body to be processed using the organic film having the transferred pattern as a mask to form the pattern in the body to be processed.

14. A patterning process comprising the steps of:
forming an organic film by using the composition for forming an organic film according to claim 1 on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching using the resist upper layer film having the formed circuit pattern as a mask;
transferring the pattern to the organic film by etching using the inorganic hard mask having the formed pattern as a mask; and
etching the body to be processed using the organic film having the formed pattern as a mask to form the pattern in the body to be processed.

15. The patterning process according to claim 14, wherein the inorganic hard mask is formed by a CVD method or an ALD method.

16. A patterning process comprising the steps of:
forming an organic film by using the composition for forming an organic film according to claim 1 on a body to be processed;
forming an inorganic hard mask selected from a silicon oxide film, a silicon nitride film, and a silicon oxynitride film on the organic film;
forming a BARC on the inorganic hard mask;
forming a resist upper layer film by using a photoresist composition on the BARC;
forming a circuit pattern in the resist upper layer film;
successively transferring the pattern to the BARC and the inorganic hard mask by etching using the resist upper layer film having the formed circuit pattern as a mask;
transferring the pattern to the organic film by etching using the inorganic hard mask having the formed pattern as a mask; and
etching the body to be processed using the organic film having the formed pattern as a mask to form the pattern in the body to be processed.

17. A polymer comprising a partial structure shown by the following general formula (1A) as a repeating unit,

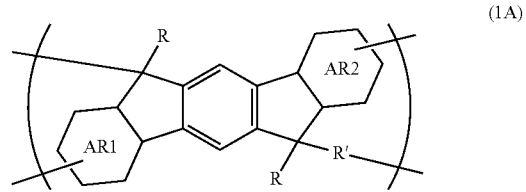

wherein
AR1 and AR2 each represent a benzene ring or a naphthalene ring which further optionally have a substituting group that is substituting a hydrogen atom directly bonded to the benzene ring or the naphthalene ring;
each R represents a hydrogen atom or a monovalent organic group having 2 to 10 carbon atoms and an unsaturated bond;
R' represents a single bond or W1; and
W1 represents a divalent organic group having 6 to 80 carbon atoms and one or more aromatic rings.

18. The polymer according to claim 17, wherein the general formula (1A) is shown by the following general formula (1B),

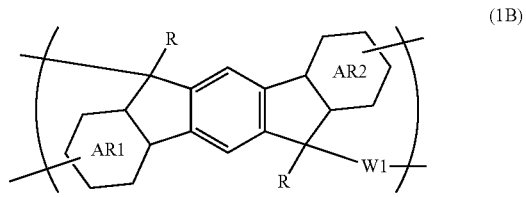

wherein AR1, AR2, R, and W1 are as defined above.

19. The polymer according to claim 18, wherein each R in the general formulae (1A) and (1B) is a hydrogen atom or any structure shown in the following formula (1C),

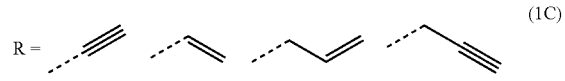

-continued
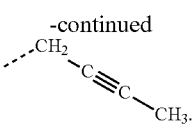
20. The polymer according to claim 17, wherein the divalent organic group represented by W1 has at least any of a naphthalene ring, a fluorene ring, and a carbazole ring.
* * * * *